US006760251B2

(12) United States Patent
Hidaka

(10) Patent No.: US 6,760,251 B2
(45) Date of Patent: Jul. 6, 2004

(54) MEMORY DEVICE READING DATA ACCORDING TO DIFFERENCE IN ELECTRICAL RESISTANCE BETWEEN SELECTED MEMORY CELL AND REFERENCE CELL

(75) Inventor: Hideto Hidaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 1 day.

(21) Appl. No.: 10/330,107

(22) Filed: Dec. 30, 2002

(65) Prior Publication Data

US 2004/0008556 A1 Jan. 15, 2004

(30) Foreign Application Priority Data

Jul. 11, 2002 (JP) ........................................ 2002-202659

(51) Int. Cl.⁷ .............................................. G11C 11/14
(52) U.S. Cl. ........................ 365/171; 365/158; 365/210
(58) Field of Search ................................ 365/171, 173, 365/158, 63, 210, 230.07

(56) References Cited

U.S. PATENT DOCUMENTS

| | | | | | |
|---|---|---|---|---|---|
| 6,055,178 | A | * | 4/2000 | Naji ........................... | 365/158 |
| 6,606,263 | B1 | * | 8/2003 | Tang ........................... | 365/158 |
| 6,614,681 | B2 | * | 9/2003 | Hidaka ........................ | 365/171 |
| 2004/0017718 | A1 | * | 1/2004 | Ooishi ........................ | 365/210 |

FOREIGN PATENT DOCUMENTS

JP 2001-236782 8/2001
JP 2001-237472 8/2001

OTHER PUBLICATIONS

R. Scheuerlein, et al., "A 10ns Read and Write Non–Volatile Memory Array Using a Magnetic Tunnel Junction and FET Switch in Each Cell", ISSCC Digest of Technical Papers, TA7.2, Feb. 2000.
M. Durlam, et al., "Nonvolatile RAM based on Magnetic Tunnel Junction Elements", ISSCC Digest of Technical Papers, TA7.3, Feb. 2000.
P. K. Naji, et al., "A 256kb 3.0V 1T1MTJ Nonvolataile Magnetoresistive RAM", ISSCC Digest of Technical Papers, TA7.6, Feb. 2001.

* cited by examiner

*Primary Examiner*—Richard Elms
*Assistant Examiner*—Hien Nguyen
(74) *Attorney, Agent, or Firm*—Burns, Doane, Swecker & Mathis, L.L.P.

(57) ABSTRACT

Source lines having a high electrical resistance are placed to extend in the same direction as that in which reference cells are arranged. A balance is thus achieved, in terms of the length of the path on lines extending in the direction orthogonal to that in which reference cells are arranged, between current paths passing respectively through a selected memory cell and a selected reference cell, regardless of the result of address selection. Accordingly, a difference in electrical resistance between these current paths reflects a difference in electrical resistance between the selected memory cell and the selected reference cell regardless of the address selection, which improves a data reading margin.

20 Claims, 17 Drawing Sheets

MEMORY DEVICE READING DATA ACCORDING TO DIFFERENCE IN ELECTRICAL RESISTANCE BETWEEN SELECTED MEMORY CELL AND REFERENCE CELL

BACKGROUND OF THE INVENTION

1. Field of the Invention

The present invention relates to memory devices. In particular, the present invention relates to a memory device typified by a thin-film magnetic memory device including memory cells having an electrical resistance value varying according to the data level of storage data.

2. Description of the Background Art

An MRAM (Magnetic Random Access Memory) device is now the focus of attention as a memory device capable of storing data in nonvolatile manner with low power consumption. The MRAM device uses a plurality of thin-film magnetic elements formed in a semiconductor integrated circuit to store data in nonvolatile manner, with each of the thin-film magnetic elements being used as a memory cell which is randomly accessible.

In recent years, it has been published that memory cells of thin-film magnetic elements with magnetic tunnel junctions are used to achieve dramatic improvements in performance of the MRAM device. The MRAM device including memory cells with magnetic tunnel junctions is disclosed for example in technical papers: "A 10 ns Read and Write Non-Volatile Memory Array Using a Magnetic Tunnel Junction and FET Switch in each Cell," ISSCC Digest of Technical Papers, TA7.2, February 2000, "Nonvolatile RAM based on Magnetic Tunnel Junction Elements," ISSCC Digest of Technical Papers, TA7.3, February 2000 and "A 256 kb 3.0V 1T1MTJ Nonvolatile Magnetoresistive RAM," ISSCC Digest of Technical Papers, TA7.6, February 2001.

FIG. 16 schematically shows a structure of a memory cell having a magnetic tunnel junction (this memory cell is hereinafter referred to as "MTJ memory cell").

Referring to FIG. 16, the MTJ memory (X>) cell includes a tunneling magneto-resistance element TMR having an electrical resistance value varying according to the data level of magnetically written storage data and includes an access transistor ATR. The access transistor ATR is connected in series with the tunneling magneto-resistance element TMR between a bit line BL and a source line SL. The access transistor ATR is typically a field-effect transistor formed on a semiconductor substrate.

To the MTJ memory cell, the bit line BL and a digit line DL for allowing respective data write currents to flow in different directions respectively in data writing, a word line WL for conducting data reading, and the source line SL for pulling down the tunneling magneto-resistance element TMR to a fixed voltage (e.g. ground voltage GND) in data reading are provided. In data reading, the access transistor ATR is turned on and, in response to this turn-on, the tunneling magneto-resistance element TMR is electrically coupled between the source line SL and the bit line BL.

FIG. 17 conceptually shows an operation of writing data into the MTJ memory cell.

Referring to FIG. 17, the tunneling magneto-resistance element TMR includes a ferromagnetic layer FL having a fixed direction of magnetization (hereinafter referred to as "fixed magnetic layer"), and a ferromagnetic layer VL magnetized in a direction according to an externally applied magnetic field (hereinafter referred to as "free magnetic layer"). Between the fixed magnetic layer FL and the free magnetic layer VL, a tunneling barrier (tunneling film) TB formed of an insulating film is provided. According to the level of storage data to be written, the free magnetic layer VL is magnetized in the same direction as or in a different direction from the direction in which the fixed magnetic layer FL is magnetized. These fixed magnetic layer FL, tunnel barrier TB and free magnetic layer VL form a magnetic tunnel junction.

The tunneling magneto-resistance element TMR has an electrical resistance value varying according to a relative relation between respective directions of magnetization of the fixed magnetic layer FL and the free magnetic layer VL. Specifically, the tunneling magneto-resistance element TMR has a minimum electrical resistance value Rmin when the fixed magnetic layer FL has a magnetization direction which is the same as (in parallel with) that of the free magnetic layer VL and has a maximum electrical resistance value Rmax when respective magnetization directions of the fixed magnetic layer FL and the free magnetic layer VL are opposite to (in antiparallel with) each other.

In data writing, the word line WL is inactivated to turn off the access transistor ATR. In this state, a data write current for magnetizing the free magnetic layer VL flows through each of the bit line BL and the digit line DL according to the level of data to be written.

FIG. 18 conceptually shows a relation between the data write current and the magnetization direction of the tunneling magneto-resistance element in data writing.

Referring to FIG. 18, the horizontal axis H (EA) represents a magnetic field applied in the direction of an axis of easy magnetization (EA: Easy Axis) in the free magnetic layer VL in the tunneling magneto-resistance element TMR. The vertical axis H (HA) represents a magnetic field acting in the direction of an axis of hard magnetization (HA: Hard Axis) in the free magnetic layer VL. The magnetic field H (EA) and the magnetic field H (HA) correspond respectively to two magnetic fields generated by respective currents flowing through the bit line BL and the digit line DL.

In the MTJ memory cell, the fixed magnetization direction of the fixed magnetic layer FL is in parallel with the easy axis of the free magnetic layer VL, and the free magnetic layer VL is magnetized in the direction which is in parallel or antiparallel with (opposite to) the fixed magnetic layer FL in the direction of the easy axis. The MTJ memory cell is capable of storing 1-bit data ("1" or "0") according to the two magnetization directions of the free magnetic layer VL.

The magnetization direction of the free magnetic layer VL is only rewritable when the sum of the applied magnetic fields H (EA) and H (HA) falls within the region outside the asteroid characteristic line shown in FIG. 18. In other words, if the intensity of the applied data write fields corresponds to the region inside the asteroid characteristic line, the magnetization direction of the free magnetic layer VL is not changed.

As indicated by the asteroid characteristic line, a magnetic field in the direction of the hard axis can be applied to the free magnetic layer VL to reduce a magnetization threshold which is necessary for changing the magnetization direction along the easy axis.

Suppose that operating points for data writing are designed as shown in FIG. 18. Then, for the MTJ memory cell into which data is to be written, a data write magnetic field in the direction of the easy axis is designed to have its intensity equal to $H_{WR}$. More specifically, the value of a data write current flowing through the bit line BL or the digit line DL is designed to obtain this data write magnetic field $H_{WR}$. In general, the data write magnetic field $H_{WR}$ is represented by the sum of a switching magnetic field Hsw necessary for changing the magnetization direction and a margin $\Delta H$: $H_{WR}=H_{SW}+\Delta H$.

In order to rewrite storage data of the MTJ memory cell, i.e., rewrite the magnetization direction of the tunneling magneto-resistance element TMR, a data write current of at least a predetermined level must be flown through both of the digit line DL and the bit line BL. Accordingly, the free magnetic layer VL in the tunneling magneto-resistance element TMR is magnetized in the direction in parallel with or opposite to (antiparallel with) the fixed magnetic layer FL according to the direction of a data write magnetic field along the easy axis (EA). The magnetization direction once written into the tunneling magneto-resistance element TMR, i.e., storage data in the MTJ memory cell, is held in nonvolatile manner until execution of writing of new data.

FIG. 19 conceptually shows an operation of reading data from the MTJ memory cell.

Referring to FIG. 19, in the data reading operation, the access transistor ATR is turned on in response to activation of the word line WL. Then, the tunneling magneto-resistance element TMR pulled down to a predetermined voltage Vss is electrically coupled to the bit line BL.

In this state, the bit line BL is pulled up to a predetermined voltage to allow a memory cell current to flow through a current path including the bit line BL and the tunneling magneto-resistance element TMR Icell, according to an electrical resistance of the tunneling magneto-resistance element TMR, i.e., the level of storage data in the MTJ memory cell. For example, the memory cell current Icell can be compared with a predetermined reference current Iref (not shown) to read the storage data from the MTJ memory cell.

The tunneling magneto-resistance element TMR thus has its electrical resistance varying according to the magnetization direction which is rewritable by an applied data write magnetic field. Then, nonvolatile data storage can be executed by correlating electrical resistances Rmax and Rmin of the tunneling magneto-resistance element TMR respectively with levels ("1" and "0") of storage data.

As discussed above, for the MRAM device, data is stored by using a difference in electrical resistance that is a difference in junction resistance of the tunneling magneto-resistance element TMR according to a difference in level of storage data, i.e., $\Delta R=(Rmax-Rmin)$. In other words, a memory cell current flowing through a selected memory cell is sensed to read data.

For data reading, a reference cell is provided separately from a normal memory cell for storing data therein, the reference cell being used for generating the reference current to be compared with the memory cell current as described above. Such a reference cell is designed to have a value intermediate between two electrical resistances Rmax and Rmin of the MTJ memory cell.

In data reading, a current path for the memory cell current including a selected memory cell (hereinafter referred to as "memory cell current path") and a current path for the reference current including a reference cell (hereinafter referred to as "reference current path") are provided. Currents passed through respective paths are compared with each other to read data.

Generally, the tunneling magneto-resistance element has an electrical resistance of the level corresponding to a few tens of $K\Omega$. In data reading, a low voltage of approximately 0.5 V is applied to both of the two ends of the tunneling magneto-resistance element and accordingly a memory cell current of approximately 20 $\mu A$ is generated. In this case, a difference in current caused by the electrical resistance difference $\Delta R$ discussed above is a few tens of $\mu A$. Therefore, for sensing a difference in electrical resistance between the selected memory cell and the reference cell, the currents must be compared with a high sensitivity.

Then, if respective electrical resistances of those two current paths except for the selected memory cell and the reference cell (hereinafter referred to as "path resistance") are different to a great degree, the electrical resistance difference between the selected memory cell and the reference cell cannot be read precisely, resulting in deterioration in data reading precision.

MTJ memory cells of the MRAM device are generally arranged in rows and columns in integrated manner. Therefore, depending on the position of a selected memory cell indicated by address selection, at least the memory cell current path varies. Here, consideration must be taken not to change the difference in path resistance between the memory cell current path and the reference current path depending on the address selection. It is noted that such a problem is common to MRAM devices and memory devices including memory cells having an electrical resistance varying according to the level of storage data.

SUMMARY OF THE INVENTION

One object of the present invention is to improve a data reading margin of a memory device which reads data according to a difference in electrical resistance between a reference cell and a selected memory cell.

According to one aspect of the present invention, a memory device includes a memory array having a plurality of memory cells and a plurality of reference cells arranged in rows and columns, the plurality of memory cells each having one of electrical resistances of respective two levels according to storage data and the reference cells each being provided as a comparison target for selected one of the plurality of memory cells in data reading. The reference cells are arranged along one of the rows and the columns to share the other of the rows and the columns with the memory cells. The memory device further includes a plurality of word lines provided correspondingly to the rows respectively and activated in a selected row, a plurality of data lines provided correspondingly to the columns respectively, and a plurality of source lines provided correspondingly to that one of the rows and the columns respectively, the source lines each supplying a fixed voltage. The memory cells each include a storage element having an electrical resistance varying according to the storage data and an access element turned on in response to activation of corresponding one of the word lines, and the storage element and the access element are connected in series between corresponding one of the data lines and corresponding one of the source lines. The data lines include a first data line connected to a selected memory cell among the memory cells that is selected as a cell with data to be read in the data reading, and a second data line connected to a selected reference cell among the reference cells in the data reading, and the selected reference cell shares the other of the rows and the columns with the selected memory cell. The memory device further includes a data reading circuit coupling, in the data reading, the first and second data lines to a voltage different from the fixed voltage to form first and second current paths respectively passing the selected memory cell and the selected reference cell, and the data reading circuit reads the storage data from the selected memory cell according to a difference in electrical resistance between the first and second current paths.

One chief advantage of the present invention is that the first current path including the selected memory cell and the second current path including the selected reference cell are balanced, in terms of the length of the path on the source lines having a relatively high electrical resistance, regardless of the result of address selection, by providing reference cells in the direction which is the same as the direction in which the source lines are provided to extend. Accordingly, a difference in the total electrical resistance between the first and second current paths indicates a difference in electrical resistance between the selected memory cell and the selected reference cell, and thus the deterioration in data reading margin depending on the result of address selection is prevented to stabilize data reading operation.

According to another aspect of the present invention, a memory device includes a memory array having a plurality of memory cells and a plurality of reference cells arranged in rows and columns, the memory cells each having one of electrical resistances of respective two levels according to storage data and the reference cells each being provided as a comparison target for selected one of the plurality of memory cells in data reading. The reference cells are arranged along the rows to share the columns with the memory cells. The memory device further includes a plurality of word lines provided correspondingly to the rows respectively and activated in a selected row, a plurality of data lines provided correspondingly to the columns respectively, and a plurality of source lines provided correspondingly to the columns respectively, the source lines each supplying a fixed voltage. The memory cells each include a storage element having an electrical resistance varying according to the storage data and an access element turned on in response to activation of corresponding one of the word lines. The storage element and the access element are connected in series between corresponding one of the data lines and corresponding one of the source lines. The data lines include a first data line connected to a selected memory cell among the memory cells that is selected as a cell with data to be read in the data reading, and a second data line connected to a selected reference cell among the reference cells in the data reading. The selected reference cell shares the columns with the selected memory cell. The memory device further includes a data reading circuit coupling, in the data reading, the first and second data lines to a voltage different from the fixed voltage to form first and second current paths respectively passing the selected memory cell and the selected reference cell. The data reading circuit reads the storage data from the selected memory cell according to a difference in electrical resistance between the first and second current paths. An electrical resistance per unit length of the data lines is designed to be substantially equal to an electrical resistance per unit length of the source lines.

The above-discussed memory device has a configuration where reference cells are arranged along the row direction, and the source lines and data lines arranged in the column direction have respective electrical resistances per unit length that are substantially equal to each other. Then, regarding the first current path including the selected memory cell and the second current path including the selected reference cell, the electrical resistance of the first current path except for the selected memory cell is balanced with the electrical resistance of the second current path except for the selected reference cell, regardless of the result of address selection. Accordingly, a difference in the total electrical resistance between the first and second current paths indicates a difference in electrical resistance between the selected memory cell and the selected reference cell, and thus the deterioration in data reading margin depending on the result of address selection is prevented to stabilize data reading operation.

According to still another aspect of the present invention, a memory device includes a memory array having a plurality of memory cells and a plurality of reference cells arranged in rows and columns. The memory cells each have one of electrical resistances of respective two levels according to storage data. The reference cells are each provided as a comparison target for selected one of the plurality of memory cells in data reading. The reference cells are arranged along the columns to share the rows with the memory cells. The memory device further includes a plurality of word lines provided correspondingly to the rows respectively and activated in a selected row, a plurality of data lines provided correspondingly to the columns respectively, and a plurality of source lines provided correspondingly to the rows respectively, the source lines each supplying a fixed voltage. The memory cells each include a storage element having an electrical resistance varying according to the storage data and an access element turned on in response to activation of corresponding one of the word lines, the storage element and the access element being connected in series between corresponding one of the data lines and corresponding one of the source lines. The data lines include a first data line connected to a selected memory cell among the memory cells that is selected as a cell with data to be read in the data reading, and a second data line connected to a selected reference cell among the reference cells in the data reading, the selected reference cell sharing the rows with the selected memory cell. The memory device further includes first and second data buses provided along the rows in a region adjacent to the memory array, the first and second data buses being connected electrically to the first and second data lines in the data reading. The data reading circuit couples, in the data reading, the first and second data buses to a voltage different from the fixed voltage to form first and second current paths respectively passing the selected memory cell and the selected reference cell. The data reading circuit reads the storage data from the selected memory cell according to a difference in electrical resistance between the first and second current paths. An electrical resistance per unit length of the source lines is designed to be substantially equal to an electrical resistance per unit length of the first and second data lines.

The above-described memory device has a configuration with reference cells arranged in the direction of columns. The source lines and the first and second data buses arranged in the row direction are designed to have respective electrical resistances per unit length that are substantially equal to each other. Then, regarding the first current path including the selected memory cell and the second current path including the selected reference cell, the electrical resistance of the first current path except for the selected memory cell is balanced with that of the second current path except for the selected reference cell, regardless of the result of address selection. Accordingly, a difference in the total electrical resistance between the first and second current paths indicates a difference in electrical resistance between the selected memory cell and the selected reference cell, and the deterioration in data reading margin depending on the result of address selection is thus prevented to stabilize data reading operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
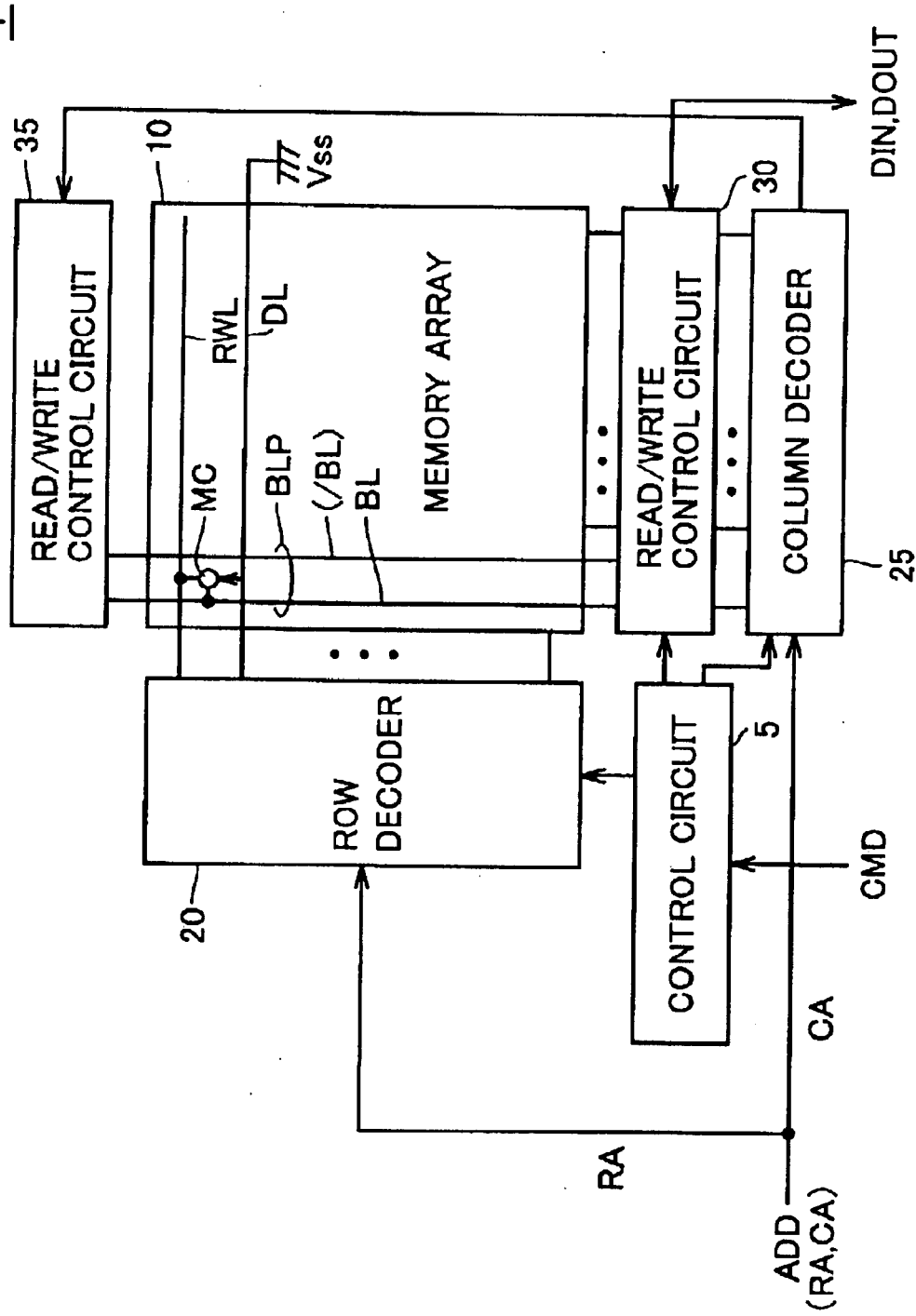
FIG. 1 is a schematic block diagram showing an entire configuration of an MRAM device according to embodiments of the present invention.

Embodiments of the present invention are hereinafter described in detail in connection with the drawings where the same reference characters indicate the same or corresponding components.

First Embodiment

FIG. 1 shows an MRAM device 1 as a representative example of a memory device according to the present invention. As is apparent from the following description, application of the present invention is not limited to the MRAM device, and the present invention is applicable to memory devices having memory cells with an electrical resistance value varying according to the level of storage data.

Referring to FIG. 1, in response to externally supplied control signal CMD and address signal ADD, MRAM device 1 executes random access, inputs write data DIN and outputs read data DOUT.

MRAM device 1 includes a control circuit 5 controlling the whole of MRAM device 1 in response to control signal CMD, and a memory array 10 including MTJ memory cells MC arranged in rows and columns.

In memory array 10, read word lines RWL and digit lines DL are arranged correspondingly to respective rows of the MTJ memory cells (hereinafter referred to as "memory cell row"), and bit lines BL are arranged correspondingly to respective columns of the MTJ memory cells (hereinafter referred to as "memory cell column"). Alternatively, bit line pairs BLP of bit lines BL and /BL may be arranged correspondingly to respective memory cell columns as the folded bit line structure. In FIG. 1, an arrangement is shown of one representative MTJ memory cell MC as well as a read word line RWL, a digit line DL and a bit line BL (or a pair of bit lines BL and /BL) corresponding to the MTJ memory cell MC.

MRAM device 1 further includes a row decoder 20 decoding a row address RA indicated by the address signal to execute row selection in memory array 10, a column decoder 25 decoding a column address CA indicated by the address signal ADD to execute column selection in memory array 10, and read/write control circuits 30 and 35.

Read/write control circuits 30 and 35 represent circuitry for writing data into memory array 10 as well as circuitry for reading data from memory array 10.

Digit line DL is coupled to a predetermined voltage Vss (e.g. ground voltage) in a region opposite to row decoder 20 with memory array 10 therebetween.

Figure 2:
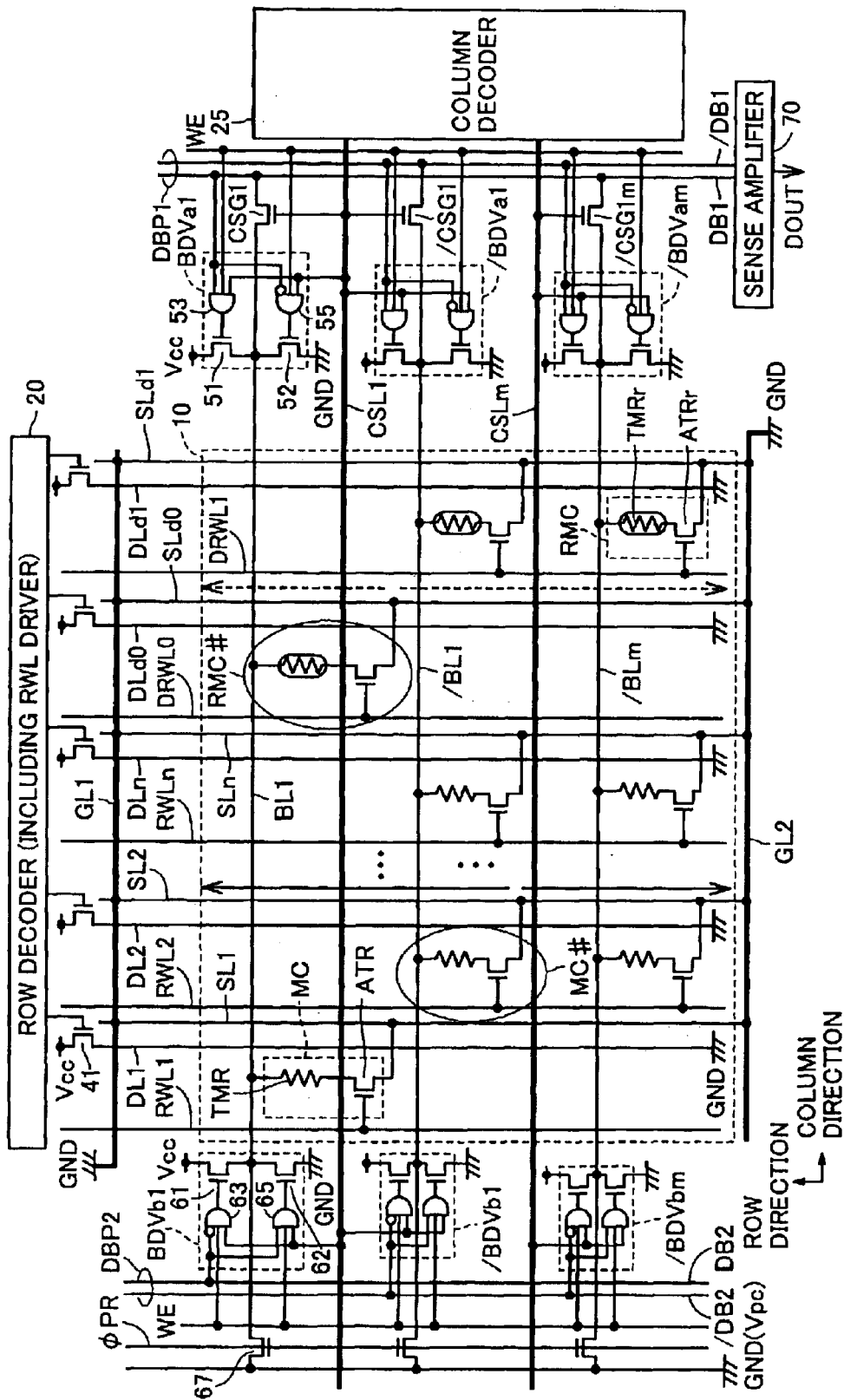
FIG. 2 is a circuit diagram showing a configuration of a memory array and peripheral circuitry thereof according to a first embodiment.

Referring to FIG. 2, memory array 10 includes a plurality of MTJ memory cells MC arranged in a matrix of n rows×m columns (n, m: natural number). The MTJ memory cells may hereinafter be referred to as memory cells.

Correspondingly to respective memory cell rows, read word lines RWL1–RWLn, digit lines DL1–DLn and source lines SL1–SLn are arranged. Correspondingly to respective memory cell columns, complimentary bit lines BL1, /BL1–BLm, /BLm are provided.

Source lines SL1–SLn each have two ends connected respectively to ground lines GL1 and GL2 to supply a ground voltage GND to memory cells MC. Read word lines RWL1–RWLn, digit lines DL1–DLn, bit lines BL1–BLm and /BL1–/BLm and source lines SL1–SLn may hereinafter be referred to collectively as read word line RWL, digit line DL, bit lines BL and /BL and source line SL. Binary high-voltage state (e.g. power supply voltage Vcc) and low-voltage state (e.g. ground voltage GND) of a signal, a signal line and data are also referred to as "H level" and "L level" respectively.

Figure 16:
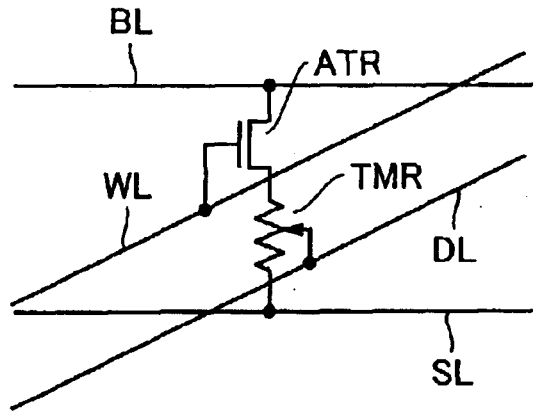
FIG. 16 schematically shows a structure of an MTJ memory cell.
Figure 17:
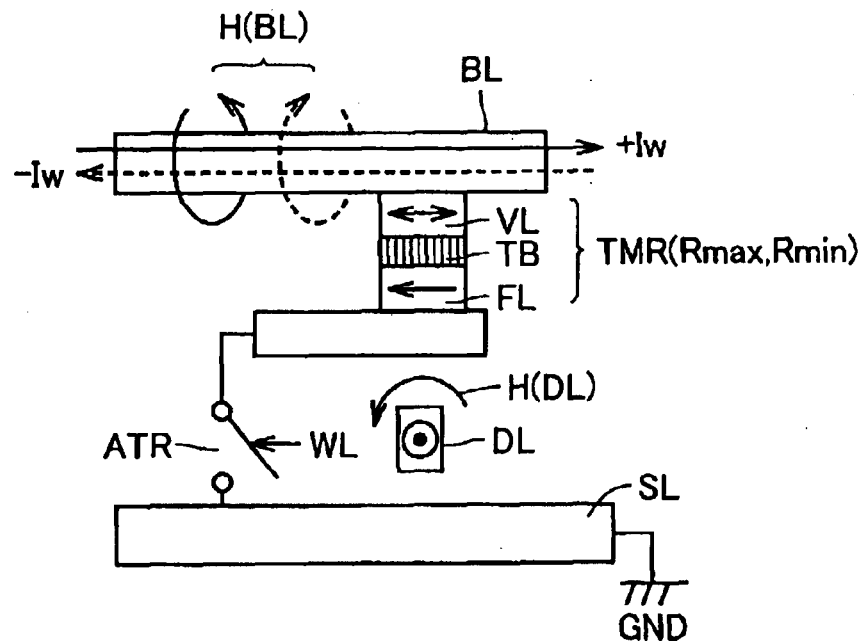
FIG. 17 conceptually shows an operation of writing data into the MTJ memory cell.
Figure 18:
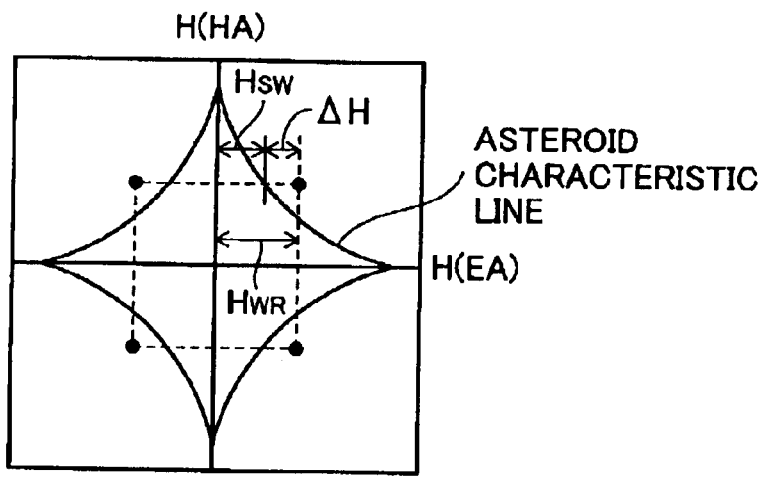
FIG. 18 conceptually shows a relation between a data write current and the magnetization direction of a tunneling magneto-resistance element in data writing.
Figure 19:
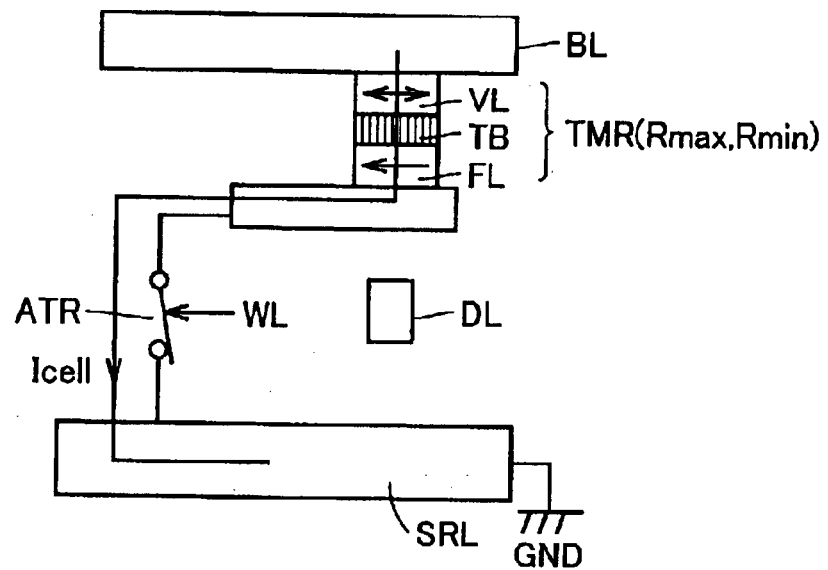
FIG. 19 conceptually shows an operation of reading data from the MTJ memory cell.

Memory cells MC are each structured in a similar manner to that shown in FIG. 16 to include a tunneling magneto-resistance element TMR and an access transistor ATR connected in series between a corresponding bit line BL or /BL and a corresponding source line SL. The gate of access transistor ATR is connected to a corresponding read word line RWL. Tunneling magneto-resistance element TMR is magnetized in the direction corresponding to storage data ("1" or "0") to have one of electrical resistances Rmax and Rmin. The element corresponding to tunneling magneto-resistance element TMR may be replaced with another element having an electrical resistance varying according to the level of storage data.

In a strict sense, the electrical resistance of each memory cell is the sum of tunneling magneto-resistance element TMR, ON resistance of access transistor ATR and other parasitic resistances. However, the resistances of those except for tunneling magneto-resistance element TMR are constant regardless of storage data. Then, the two electrical resistances of a normal memory cell according to storage data are indicated by Rmax and Rmin and the difference therebetween is indicated by ΔR (i.e., ΔR=Rmax−Rmin).

Memory cells MC in alternate rows are coupled to one of bit lines BL1–BLm and /BL1–/BLm. Memory cells MC in odd-numbered rows (e.g. first row) are coupled to bit lines BL1–BLm while memory cells MC in even-numbered rows (e.g. second row) are coupled to bit lines /BL1–/BLm.

In memory array 10, 2×m reference cells RMC are further arranged in the row direction to constitute two rows of reference cells. The reference cells RMC each is provided as comparison target for selected one of the memory cells MC in data reading. These reference cells RMC are connected respectively to bit lines BL1, /BL1, . . . /BLm. Correspondingly to two reference cell rows, dummy read word lines DRWL0 and DRWL1 and source lines SLd0 and SLd1 are provided respectively in the row direction like read word lines RWL and source lines SL. In the following description, dummy read word lines DRWL0 and DRWL1 and source lines SLd0 and SLd1 may be referred to collectively as dummy read word line DRWL and source line SLd. Similarly to source line SL, source line SLd has its two ends connected respectively to ground lines GL1 and GL2 to supply ground voltage GND to reference cells RMC.

Reference cells RMC each include a reference resistor TMRr and an access element ATRr connected in series between a corresponding bit line BL or /BL and a corresponding source line SLd. Access element ATRr is constituted of a field effect transistor, like access transistor ATR in the MTJ memory cell, having the gate connected to corresponding one of dummy read word lines DRWL0 and DRWL1.

The electrical resistance of reference cell RMC is designed to have a level intermediate between two electrical resistances Rmax and Rmin of each memory cell MC, preferably (Rmax+Rmin)/2. For example, reference resistor TMRr is designed in the same manner as that of tunneling magneto-resistance element TMR in the MTJ memory cell MC and storage data corresponding to electrical resistance Rmin is written in advance. Then, the size of the transistor constituting access element ATRr is made different from that of access transistor ATR, or the gate voltage of access element ATRr, namely the H level voltage of dummy read word line DRWL is set at a level different from that of read word line RWL so that the reference cell having such a characteristic is obtained.

As it is unnecessary to rewrite storage data in reference cell RMC, digit lines DLd0 and DLd1 provided correspondingly to respective reference cell rows may be unnecessary. However, these digit lines ensure continuation of the pattern in the end region of memory array 10 to reduce variations in dimensions and shapes of finished elements in memory array 10.

Reference cell RMC is selected by one of dummy read word lines DRWL0 and DRWL1. In the group of reference cells selected by dummy read word line DRWL0, access elements ATRr are turned on in response to activation of dummy read word line DRWL0. Dummy read word line DRWL0 is activated, when any even-numbered row includes a selected memory cell, together with read word line RWL of the selected row. Accordingly, when an even-numbered row is selected, tunneling magneto-resistance elements TMR are electrically coupled between respective bit lines /BL0–/BLm and source line SL while reference resistors TMRr are electrically coupled between respective bit lines BL1–BLm and source line SLD0.

In the remaining reference cells selected by dummy read word line DRWL1, access elements ATRr are turned on in response to activation of dummy read word line DRWL1. Dummy read word line DRWL1 is activated, when any odd-numbered row includes a selected memory cell, together with read word line RWL of the selected row. Accordingly, when any odd-numbered row is selected, tunneling magneto-resistance elements TMR are electrically coupled between respective bit lines BL1–BLm and source line SL while reference resistors TMRr are electrically coupled between respective bit lines /BL1–/BLm and source line SLd1.

Figure 3:
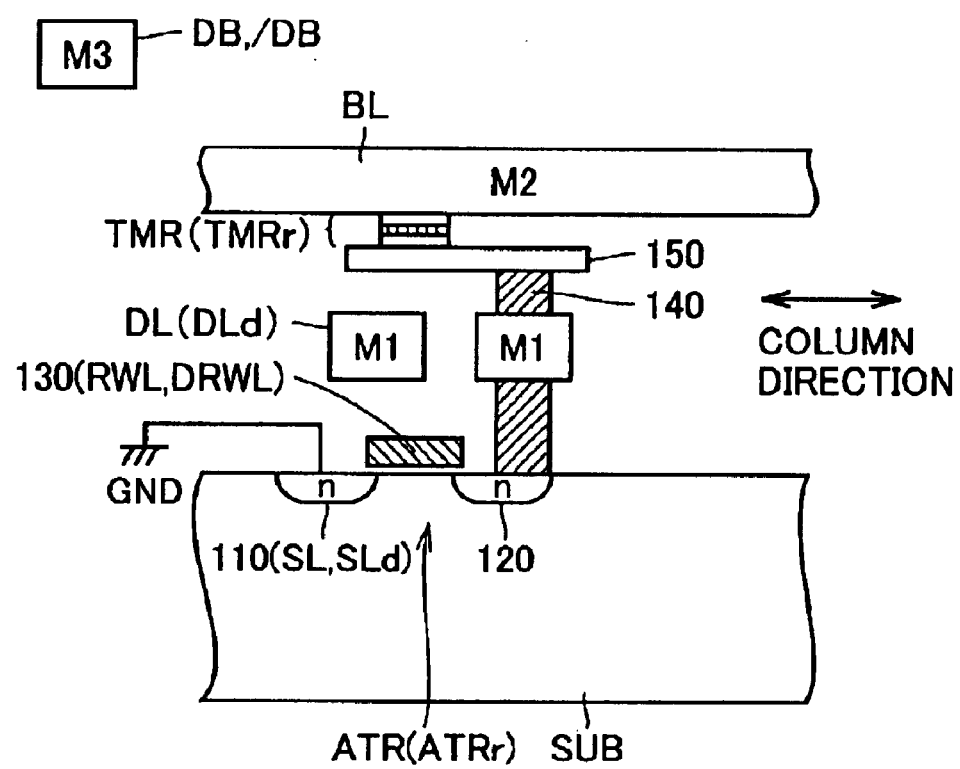
FIG. 3 is a cross sectional view showing a structure around memory cells and reference cells.

FIG. 3 is a cross sectional view showing a structure around memory cells MC and reference cells RMC.

Referring to FIG. 3, an access transistor ATR (or access element ATRr) formed on a semiconductor substrate SUB includes impurity diffusion regions 110 and 120 and a gate 130. Impurity diffusion region 110 is electrically coupled to ground voltage GND. Then, in the following description, impurity diffusion region 110 is referred to as source region while impurity region 120 is referred to as drain region.

Respective source regions 110 of access transistors ATR arranged in the same memory cell row are electrically coupled to each other. In other words, impurity diffusion regions corresponding to source region 110 are arranged to extend in the row direction on memory array 10 to constitute source line (or source line SLd) as shown in FIG. 2. As described above, source lines SL and SLd are coupled to ground voltage GND by ground lines GL1 and GL2 in the region adjacent to memory array 10.

Drain region 120 is coupled to a tunneling magneto-resistance element TMR, via a conductive strap 150, by a metal interconnection layer M1 and a metal film 140 formed in a contact hole. In a layer under tunneling magneto-resistance element TMR, a digit line DL is provided in an adjacent metal interconnection layer M1. In a layer over tunneling magneto-resistance element TMR, a bit line BL is formed in a metal interconnection layer M2. Bit line BL is electrically coupled to tunneling magneto-resistance element TMR.

A read word line RWL is generally provided as a polysilicon line provided to extend in the row direction. The polysilicon line electrically couples respective gates 130 of access transistors ATR included in the same memory cell row.

In this way, digit line DL and bit line BL for flowing a data write current therethrough constitute metal lines having a relatively small electrical resistance while source line SL and read word line RWL where it is not required to flow the data write current are formed without using metal lines. The number of metal line layers required for constituting memory cell MC and reference cell RMC can thus be decreased to reduce the size of the cells. Consequently, the area of the memory array can be reduced to downsize the device.

A configuration around memory array 10 is now described.

Referring again to FIG. 2, in the region around memory array 10, a digit line driver 41 is provided correspondingly to each memory cell row between a power supply voltage VCC and one end of digit line DL. Digit line driver 41 is constituted for example of an n-channel MOS transistor. Each digit line driver 41 has its gate receiving a decode signal which is activated to H level when the corresponding memory cell row is selected.

Then, in response to turn-on of digit line driver 41, one end and the other end of digit line DL of the selected row are coupled respectively to power supply voltage Vcc and ground voltage GND. Accordingly, a data write current can be passed in a predetermined direction from power supply voltage Vcc toward ground voltage GND through digit line DL of the selected row. The data write current in the predetermined direction allows a data write magnetic field in the direction of the hard axis (HA) to act on a corresponding memory cell.

In a region adjacent to memory array 10, data buses DB1 and /DB1 constituting a data-bus pair DBP1 and data buses DB2 and /DB2 constituting a data-bus pair DBP2 are provided in the row direction. Data-bus pairs DBP1 and DBP2 are arranged in respective areas opposite to each other with memory array 10 therebetween.

In addition, column selection lines CSL1–CSLm and column selection gates CSG1, /CSG1–CSGm, /CSGm are provided correspondingly to respective memory cell columns and precharge transistors 67 are provided correspondingly to respective bit lines BL and /BL.

According to results of decoding of column address CA and column selection, column decoder 25 activates, an appropriate one of column selection lines CSL1–CSLm following the result of column selection, into a selected state (H level).

Column selection gates CSG1, /CSG1–CSGm, /CSGm are provided in a region corresponding to read/write control circuit 30 shown in FIG. 1. Column selection gates CSG1–CSGm are arranged between respective bit lines BL1–BLm and data bus DB1. Column selection gates CSG1–CSGm each respond to activation of corresponding one of column selection lines CSL1–CSLm to connect data bus DB1 and a corresponding bit line BL.

Similarly, column selection gates /CSG1–/CSGm are provided between respective bit lines /BL1–/BLm and data bus /DB1. Column selection gates CSG1–/CSGm each respond to activation of corresponding one of column selection lines CSL1–CSLm to connect data bus /DB1 and a corresponding bit line /BL.

Precharge transistors 67 are provided in a region corresponding to read/write circuit 35 and electrically coupled between a precharge voltage Vpc and corresponding bit lines BL and /BL. Precharge transistors 67 are turned on in response to a precharge signal φPR. For example, ground voltage GND may be used as precharge voltage Vpc.

Precharge signal φPR is activated for precharging each of bit lines BL and /BL in a standby period of MRAM device 1 and respective periods preceding and following a data writing operation and a data reading operation in an active period of MRAM device 1, for example. On the other hand, precharge signal φPR is inactivated to L level in the data writing operation and the data reading operation in the active period of the MRAM device. In response to the inactivation, bit lines BL and /BL are each disconnected from precharge voltage Vpc (ground voltage GND).

Bit line drivers BDVa1–BDVam and bit line drivers BDVb1–BDVbm are provided correspondingly to respective two ends of bit lines BL1–BLm. Bit line drivers BDVa1–BDVam are included in read/write control circuit 30 shown in FIG. 1 and configured in the same manner. Bit line drivers BDVb1–BDVbm are included in read/write control circuit 35 shown in FIG. 1 and configured in the same manner. Here, configurations of bit line drivers BDVa1 and BDVb1 are described as representative examples.

Bit line driver BDVa1 includes a transistor 51 connected between power supply voltage Vcc and one end of bit line BL1 (where column decoder 25 is placed), a transistor 52 connected between one end of bit line 1 and ground voltage GND, and logic gates 53 and 55 for controlling respective gate voltages of transistors 51 and 52. Transistors 51 and 52 are each constituted for example of an n-channel MOS transistor.

Logic gate 53 supplies, to the gate of transistor 51, a result of an AND logic operation for three voltage levels respectively of data bus DB1, a control signal WE which is set at H level in data writing, and column selection line CSL1. Logic gate 55 supplies, to the gate of transistor 52, a result of an AND operation for three voltage levels respectively of an inverted level of data bus DB1, control signal WE and column selection line CSL1.

On the other hand, bit line driver BDVb1 includes a transistor 61 connected between power supply voltage Vcc and the other end of bit line BL1 (opposite to column decoder 25), a transistor 62 connected between the other end of bit line BL1 and ground voltage GND, and logic gates 63 and 65 for controlling respective gate voltages of transistors 61 and 62. Transistors 61 and 62 are each constituted for example of an n-channel MOS transistor.

Logic gate 63 supplies, to the gate of transistor 61, a result of an AND logic operation for three voltage levels respectively of an inverted level of data bus DB2, control signal WE and column selection line CSL1. Logic gate 65 supplies, to the gate of transistor 62, a result of an AND operation for three voltage levels respectively of data bus DB2, control signal WE and column selection line CSL1.

Moreover, bit line drivers /BDVa1–/BDVam and bit line drivers /BDVb1–/BDVbm are provided correspondingly to respective two ends of bit lines /BL1–/BLm. Bit line drivers /BDVa1–/BDVam are included in read/write control circuit 30 shown in FIG. 1 and configured in the same manner. Bit line drivers /BDVb1–/BDVbm are included in read/write control circuit 35 shown in FIG. 1 and configured in the same manner. In the following description, bit line drivers BDVa1–BDVam and BDVb1–BDVbm are referred to collectively as bit line driver BDVa and BDVb and bit line drivers /BDVa1–/BDVam and /BDVb1–/BDVbm are referred to collectively as bit line drivers /BDVa and /BDVb.

Bit line driver /BDVa differs from bit line driver BDVa only in that one of the inputs to the logic gate is data bus /DB1 instead of data bus DB1. Similarly, bit line driver /BDVb differs from bit line driver BDVb only in that one of the inputs to the logic gate is data bus /DB2 instead of data bus DB2.

In data writing, data buses DB1 and /DB1 are driven by a data write circuit (not shown) into respective voltages different from each other (e.g. power supply voltage Vcc and ground voltage GND) according to write data DIN. Similarly, data buses DB2 and /DB2 are driven into respective voltage levels complementary to each other. Here, data buses DB1 and DB2 are driven to the same voltage and data buses /DB1 and /DB2 are driven to the same voltage.

If write data into an odd-numbered column is "1", data buses DB1 and DB2 are driven to power supply voltage Vcc (H level) while data buses /DB1 and /DB2 are driven to ground voltage GND (L level). On the other hand, if write data into an odd-numbered column is "0", data buses /DB1 and /DB2 are driven to power supply voltage Vcc (H level) while data buses DB1 and DB2 are driven to ground voltage GND (L level).

The configuration as described above thus causes currents in opposite directions to flow respective bit lines BL and /BL of a selected column. The directions of these currents are controlled according to the voltage levels of data buses DB1, DB2 and /DB1, /DB2, namely the level of write data DIN.

Specifically, when data of H level (DIN="1") is written into an odd-numbered column, a data write current is passed through bit line BL of the selected column in the direction from bit line driver BDVa toward bit line driver BDVb while a data write current is passed through bit line /BL in the direction from bit line driver /BDVb toward bit line driver /BDVa. On the other hand, when data of L level (DIN="0") is written into an odd-numbered column, data write currents of opposite directions are passed respectively through bit lines BL and /BL of the selected column that are opposite to the directions in writing of the H level data. The data write currents of the directions according to write data DIN as discussed above cause a data write magnetic field in the direction of the easy axis (EA) to act on a corresponding memory cell. When data is written into an even-numbered column, data buses DB1, /DB1, DB2 and /DB2 are each driven into a level opposite to that when data is written into the odd-numbered column.

Consequently, both of the magnetic field along the hard axis from digit line DL of a selected row and the magnetic field along the easy axis from bit lines BL and /BL of a selected column act on a selected memory cell. Accordingly, tunneling magneto-resistance element TMR of the selected memory cell is magnetized in the direction according to the level of write data DIN. In data reading, read word line RWL of a selected row and column selection line CSL of a selected column are activated. FIG. 2 shows one example where read word line RWL2 and column selection line CSL1 are activated. As read word line RWL2 of the even-numbered row is activated, corresponding dummy read word line DRWL0 is activated while dummy read word line DRWL1 is inactivated. As a result, a selected memory cell MC# is connected between bit line /BL1 and source line SL2 and a selected reference cell is connected between bet line BL1 and source line SLd0.

In response to activation of column selection line CSL1, bit lines BL1 and /BL1 corresponding to the selected column are connected via data buses DB1 and /DB1 to a sense amplifier (data reading circuit) 70 for reading data stored in the selected memory cell.

Figure 4:
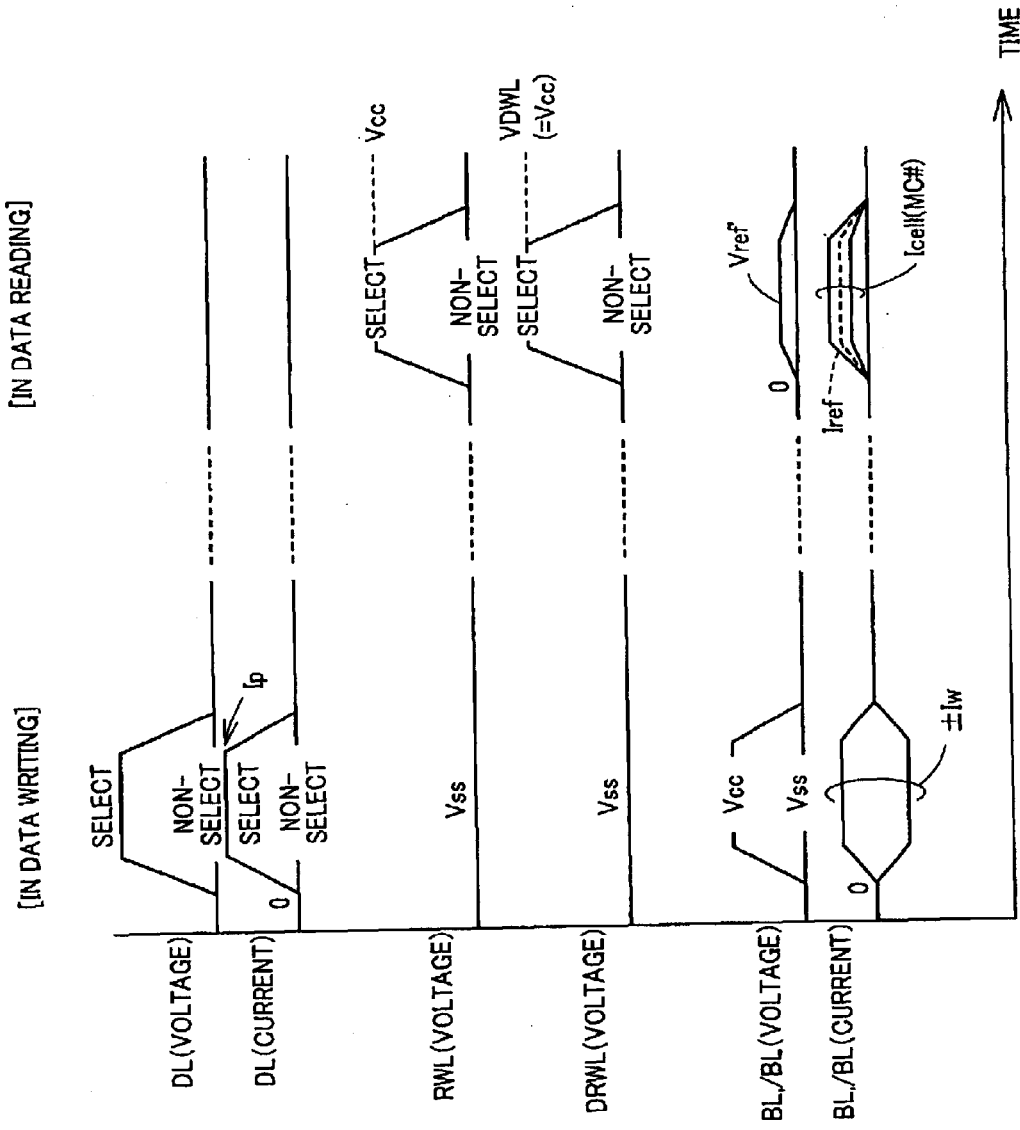
FIG. 4 is a first operation waveform chart illustrating a data writing operation and a data reading operation of the MRAM device having a reference cell.
Figure 5:
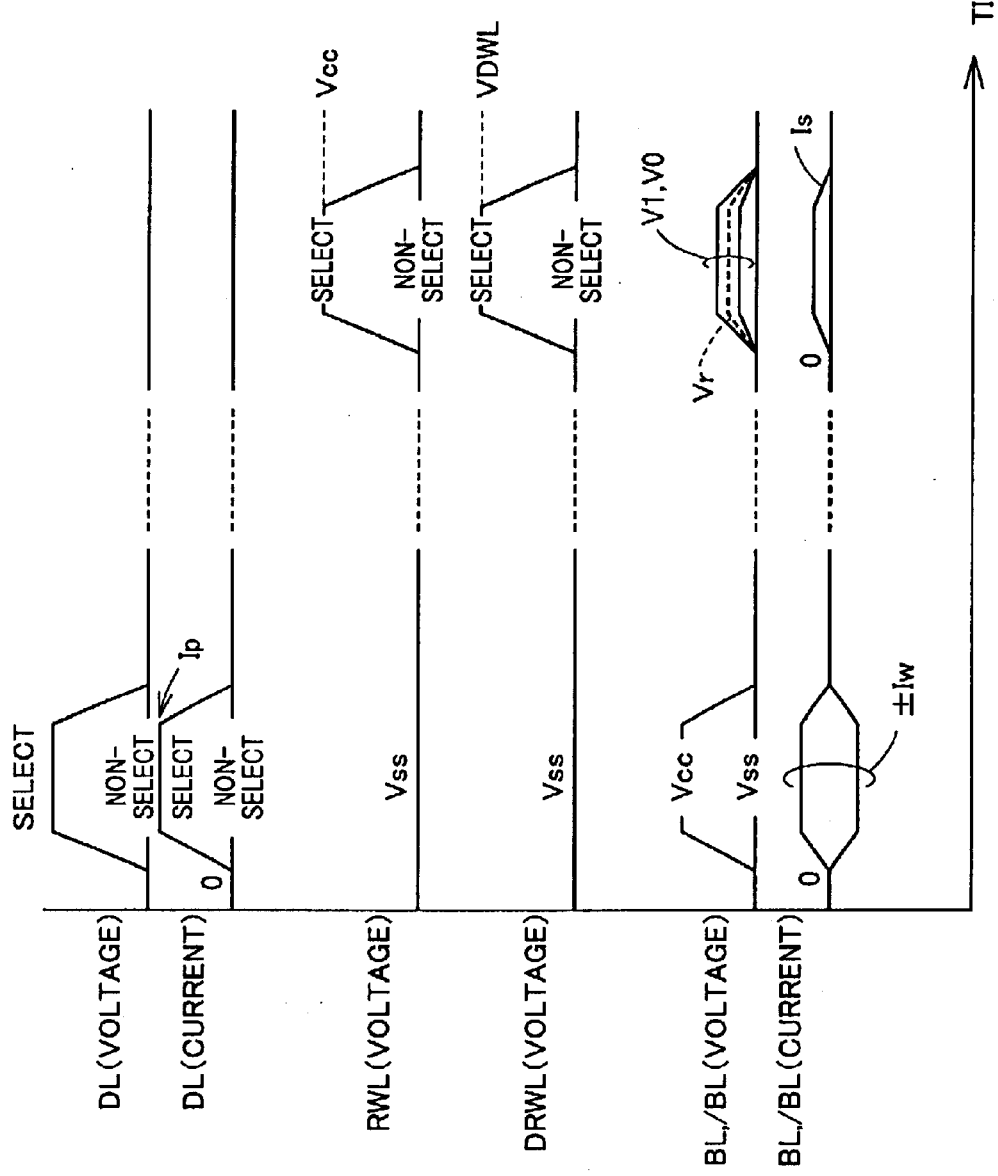
FIG. 5 is a second operation waveform chart illustrating a data writing operation and a data reading operation of the MRAM device having a reference cell.

The above-discussed operations of writing and reading data by MRAM device 1 having the reference cell are now described in conjunction with FIGS. 4 and 5.

Referring to FIG. 4, an operation waveform is shown for data writing into a selected memory cell MC#.

In data writing, each read word line RWL and each dummy read word line DRWL are inactivated to L level (ground voltage GND) while digit line DL of a selected row and column selection line CSL of a selected column are activated (not shown).

Accordingly, to digit line DL of the selected row and bit lines BL and /BL of the selected column, a data write current Ip in a predetermined direction and a data write current ±Iw in a direction according to write data are supplied respectively. Consequently, data is written into selected memory cell MC# located at the crossing of the digit line of the selected row and the bit lines of the selected column. In the actual operation, it is unnecessary to write data into reference cell RMC as described above.

In data reading, read word line RWL corresponding to the selected row and corresponding dummy read word line DRWL are activated to H level. On the other hand, each digit line DL is inactivated and thus no current is passed therethrough. Column selection line CSL of the selected column is activated (not shown).

The H level voltage of read word line RWL and dummy read word line DRWL is set according to the configuration of the reference cell. For example, if reference resistor TMRr is configured to have an electrical resistance intermediate between electrical resistances Rmax and Rmin, the H level voltage of read word line RWL and that of dummy read word line DRWL may be set at the same level (VDWL= Vcc). On the other hand, if reference resistor TMRr is designed similarly to tunneling magneto-resistance element TMR and magnetization is accomplished in the direction corresponding to electrical resistance Rmin, the ON resistance of access element ATRr should be made higher than the ON resistance of access transistor ATR. Then, H level voltage VDWL of dummy read word line DRWL is set lower than the H level voltage (Vcc) of read word line RWL.

As discussed above, when data is read with an even-numbered row selected, data buses DB1 and /DB1 are pulled down to ground voltage GND via selected memory cell MC# and selected reference cell RMC# respectively. Sense amplifier 70 connects, via data buses DB1 and /DB1, bit lines BL and /BL of the selected column each to a predetermined voltage Vref different from ground voltage GND. In general, this predetermined voltage Vref is set approximately at 0.5 V in consideration of characteristics of tunneling magneto-resistance element TMR, for example, the reliability of the tunnel film and the degree to which the junction resistance difference ΔR (=Rmax−Rmin) is likely to occur.

At this time, through one of bit lines BL and /BL of the selected column that is connected to selected memory cell MC#, one of two levels is passed as a memory cell current Icell according to storage data. On the other hand, through the other of bit lines BL and /BL of the selected column that is connected to selected reference cell RMC#, a reference current Iref having a level intermediate between the two levels is passed. Then, sense amplifier 70 detects a difference between memory cell current Icell and reference current Iref to generate read data DOUT. A general configuration for amplifying/detecting a difference in current is applicable to sense amplifier 70, and detailed circuit configuration thereof is not described here.

FIG. 5 shows a variation of the data reading operation. For the data reading operation shown in FIG. 5, sense amplifier 70 supplies a current Is of the same level to each of bit lines BL and /BL of a selected column via data buses DB1 and /DB1. Accordingly, on one of bit lines BL and /BL of the selected column that is connected to a selected memory cell MC#, a voltage V1 or V0 is generated, according to two electrical resistances (Rmax, Rmin) corresponding to storage data. On the other of bit lines BL and /BL of the selected column that is connected to a selected reference cell RMC#, a voltage Vr of a level intermediate between voltage V1 and voltage V0 is generated.

Sense amplifier 70 thus detects a voltage difference between bit lines BL and /BL to generate read data DOUT. A general configuration for amplifying/detecting a difference in voltage is applicable to sense amplifier 70, and detailed circuit configuration thereof is not described here. In addition, the operation of writing data shown in FIG. 5 is similar to that shown in FIG. 4 and description thereof is not repeated here.

In any of the operations of reading data shown in FIGS. 4 and 5, sense amplifier 70 reads data according to a difference in electrical resistance between the memory cell current path and the reference current path. Then, in order to secure a data reading margin, it is necessary that the difference in electrical resistance between the memory cell current path and the reference current path clearly reflects a difference in electrical resistance between the selected memory cell and the selected reference cell. For example, if the path resistance of the component except for the selected memory cell and the selected reference cell varies depending on address selection, the data reading margin could be decreased. It is noted that currents Is, Icell and Iref passed through bit lines in data reading are of a level considerably lower than that of current ±Iw passed through bit lines in data writing.

Description is given below of a configuration for balancing the path resistances of the memory cell current path and the reference current path in data reading.

Referring again to FIG. 2, a memory cell current is passed in data reading through a memory cell current path composed of sense amplifier 70, data bus /DB1, bit line /BL1, selected memory cell MC#, source line SL2, ground lines GL1 and GL2 and ground voltage GND. On the other hand, a reference current is passed through a reference current path composed of sense amplifier 70, data bus DB1, bit line BL1, selected reference cell RMC#, source line SLd0, ground lines GL1 and GL2, and ground voltage GND.

As described in connection with FIG. 3, source lines SL2 and SLd0 are formed of a diffusion layer of a relatively high electrical resistance. Then, the path resistances of these current paths except for selected memory cell MC# and selected reference cell RMC# respectively vary according to the lengths of the current paths on source line SL (SL2) and source line SLd. In particular, if there is a great difference between the memory cell current path and the reference current path in the length of the current path on source line SL (SL2) and on source line SLd, there arises a significant difference in path resistance between these current paths, resulting in reduction in data reading margin.

In the configuration having the reference cell rows, selected memory cell MC# and selected reference cell RMC# are included in the same memory cell column. Therefore, the path lengths on respective lines in the row direction of the memory cell current path and the reference current path are naturally balanced regardless of the result of column selection.

Then, according to the configuration of the first embodiment, source lines SL and SLd are placed in the direction which is the same as that in which reference cells are arranged, so that path resistances respectively of the memory cell current path and the reference current path are balanced regardless of the result of column selection. In other words, source lines SL and SLd are provided to extend in the row direction so as to achieve a balance, between the memory cell current path and the reference current path, of the path lengths on source line SL and source line SLd having a high electrical resistance.

Consequently, the difference in the total electrical resistance between the memory cell current path and the reference current path clearly reflects a difference in electrical resistance between selected memory cell MC# and selected reference cell RMC#. Then, it is possible to reduce reduction of the data reading margin depending on the result of address selection.

It is noted that, in the configuration having reference cell rows, there arises a difference, between the memory cell current path and the reference current path, in the path length on the line in the column direction, depending on which row is selected. However, bit lines BL and /BL and ground lines GL1 and GL2 are formed of respective metal lines of low electrical resistance. Then, there is a low possibility that such a difference in path length causes a difference in path resistance which is sufficiently large to influence the data reading margin.

Alternatively, a further desirable configuration may be provided in which bit line BL and ground lines GL1 and GL2 provided in the column direction each may be designed to have respective electrical resistances per unit length that are equal to each other. Then, the difference in path resistance between the memory cell current path and the reference current path, depending on the result of row selection, may be reduced to further improve the data reading margin. The electrical resistances per unit length may be made substantially equal by forming bit line BL and ground lines GL1 and GL2 each in the same shape and of the same material.

Moreover, as shown in FIG. 2, one end of ground line GL1 and one end of ground line GL2 are coupled to ground voltage GND to form a symmetry. Then, the memory cell current path and the reference current path are provided in symmetrical manner to further stabilize the data reading operation.

FIGS. 6A–6D show variations of the arrangement of ground lines GL1 and GL2.

Figure 6A:
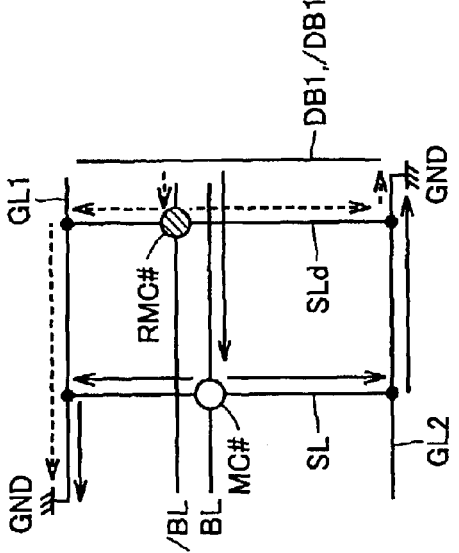
FIGS. 6A–6D conceptually show examples of arrangement of ground lines in the configuration according to the first embodiment.

Referring to FIG. 6A, both ends of ground lines GL1 and GL2 each may be connected to ground voltage GND. This arrangement also allows respective path resistances of the memory cell current path and the reference current path to be balanced regardless of the result of address selection.

Figure 6B:
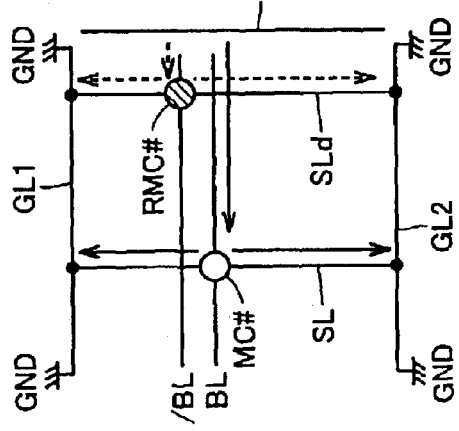

FIG. 6B shows an arrangement similar to that shown in FIG. 2. Specifically, one end of ground line GL1 and one end of ground line GL2 are symmetrically connected to ground voltage GND.

Figure 6C:
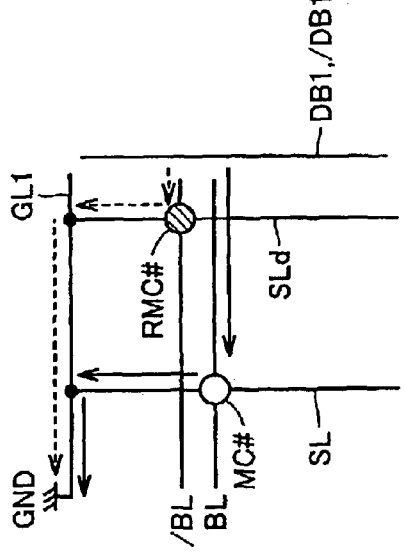

Alternatively, as shown in FIG. 6C, one end of ground line GL1 and corresponding one end of ground line GL2 that are located on the same side may be connected to ground voltage GND. Although the memory cell current path and the reference cell current path differ from each other in the length of current path on ground lines GL1 and GL2, they are balanced in terms of the lengths of the current paths on source lines SL and SLd of high electrical resistance. There is thus no considerable decrease in the data reading margin.

Figure 6D:
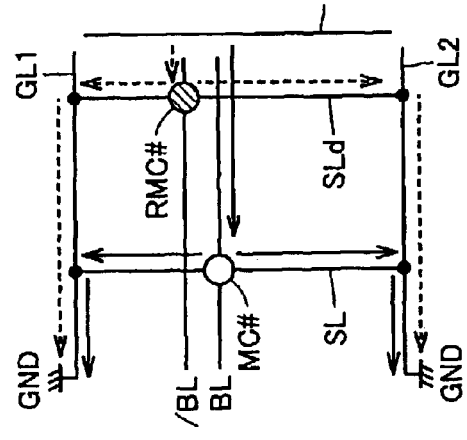

In this way, reference cells RMC are arranged in the same direction as that in which source lines SL and SLd are placed to extend. Then, even with the simple arrangement as shown in FIG. 6D where only one ground line GL1 is placed on one side of memory array 10 and one end of ground line GL1 is connected to ground voltage GND, respective path resistances of the memory cell current path and the reference current path are balanced regardless of the result of address selection to secure the data reading margin. It is noted that the configuration according to the first embodiment is applicable not only to the memory cell structure having source line SL provided as a diffusion layer but to a memory cell structure having source line SL provided as a metal line.

Second Embodiment

Figure 7:
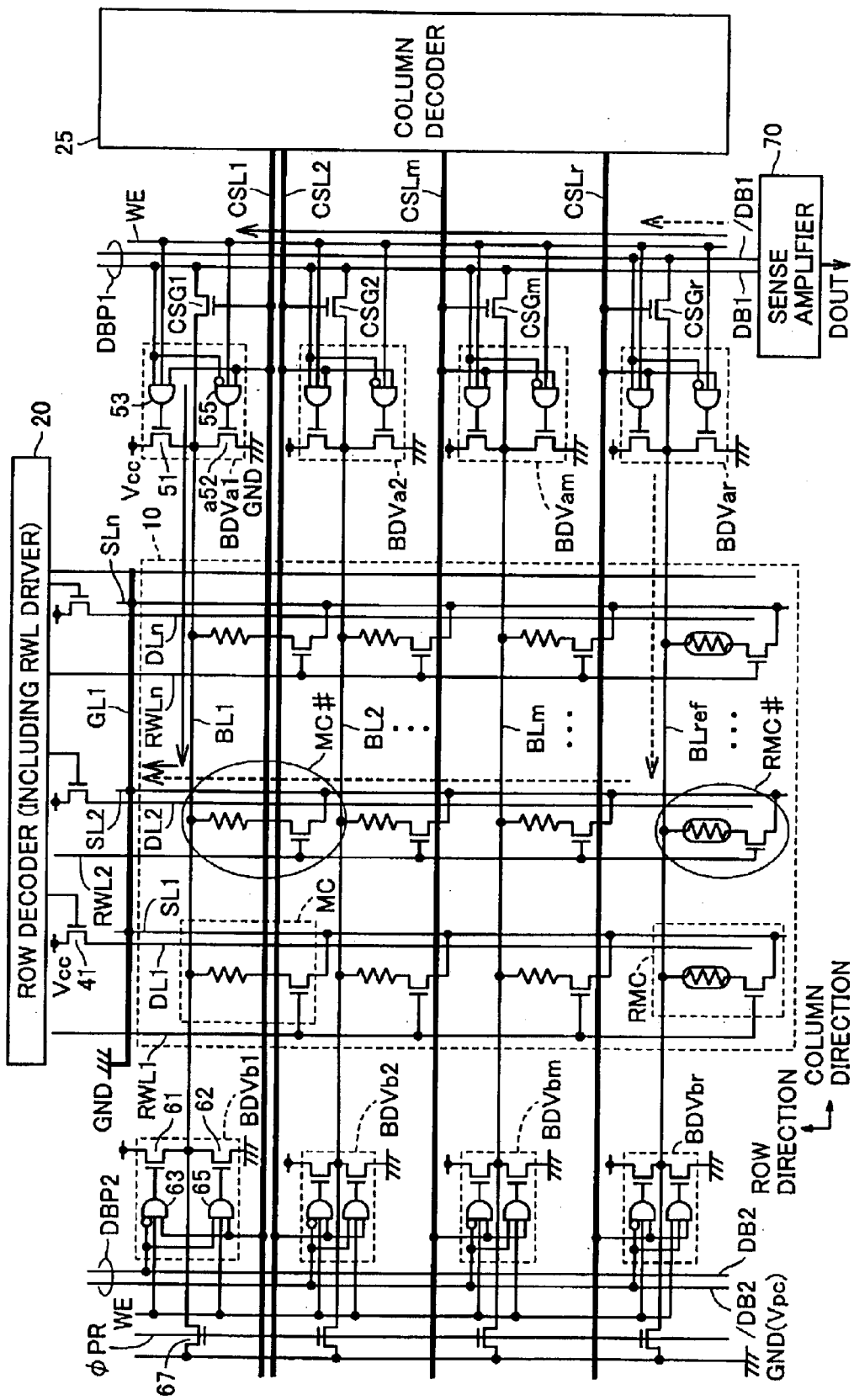
FIG. 7 is a circuit diagram showing a configuration of a memory array and peripheral circuitry thereof according to a second embodiment.

Referring to FIG. 7, a configuration according to a second embodiment differs from that of the first embodiment in that a plurality of reference cells RMC are arranged in the column direction to form a reference cell column. These reference cells RMC are arranged each to share a memory cell row with a plurality of memory cells MC.

Accordingly, bit lines BL1–BLm are connected to memory cells MC only. A reference bit line BLref is provided correspondingly to the reference cell column, and each reference cell RMC is connected between reference bit line BLref and corresponding one of source lines SL1–SLn.

As discussed above, it is unnecessary to rewrite storage data in reference cells RMC, which means that data writing into reference cell RMC is unnecessary. Then, bit line drivers may not be provided respectively on two ends of reference bit line BLref. However, bit line drivers BDVar and BDVbr are arranged as shape dummies in the configuration shown in FIG. 8. In other words, although bit line drivers BDVar and BDVbr are never used in the actual data writing operation, the shape dummies are arranged to ensure continuation of the shape in the region where the bit line drivers are arranged and thus reduce variations in dimensions and shape of finished elements around memory array 10.

Source line SL is provided in the row direction like that shown in the configuration in FIG. 2. At least one of the two ends of source line SL is coupled to ground voltage GND by a ground line. In the example shown in FIG. 7, one end of each source line (located opposite to sense amplifier 70) is connected to ground line GL1 placed in the column direction.

Bit lines BL1–BLm are connected via respective column selection gates CSG1–CSGm to data bus DB1 while reference bit line BLref is connected via a column selection gate CSGr to data bus /DB1. Column selection gate CSGr is made on in response to activation of a column selection line CSLr.

In the configuration shown in FIG. 7, column selection lines CSL1–CSLm are selectively activated according to the result of column selection in each of data reading and data writing. On the other hand, column selection line CSLr is activated in data reading and inactivated in data writing regardless of the result of column selection.

The configuration of the remaining circuitry in FIG. 7 is similar to that shown in FIG. 2 and detailed description thereof is not repeated here. An operation of writing data is executed in a similar manner to that illustrated in FIG. 2 by means of a digit line driver 41 of a selected row and bit line drivers BDVa, BDVb, /BDVa and /BDVb of a selected column.

An operation of reading data in the configuration according to the second embodiment is now described.

In FIG. 7 like FIG. 2, read word line RWL2 and column selection line CSL1 are activated to H level to select a memory cell corresponding to the second row and the first column, i.e., memory cell MC#, and a reference cell sharing the same memory cell row with selected memory cell MC# is selected as selected reference cell RMC#.

In data reading, a memory cell current is passed through a memory cell current path (indicated by the arrow of solid line in FIG. 7) composed of sense amplifier 70, data bus DB1, bit line BL1, selected memory cell MC#, source line SL2, ground line GL1 and ground voltage GND. On the other hand, a reference current is passed through a reference current path (indicated by the arrow of dotted line in FIG. 7) composed of sense amplifier 70, data bus /DB1, reference bit line BLref, selected reference cell RMC#, source line SL2, ground line GL1 and ground voltage GND.

In the configuration having the reference cell column, selected memory cell MC# and selected reference cell RMC# are included in the same memory cell row. Accordingly, the memory cell current path and the reference current path are naturally balanced in terms of the length of the path on the line in the column direction. Specifically, respective lengths of the paths on bit line BL and reference bit line BLref and respective lengths of the paths on ground line GL1 are balanced regardless of the result of column selection. On the other hand, the memory cell current path and the reference current path differ from each other in the length of the path on the line in the row direction.

Then, in the configuration like that according to the second embodiment where reference cells are arranged in the direction different from that in which source line SL is placed to extend, the memory cell current path and the reference current path inevitably differ from each other in the length of the current path on source line SL. Accordingly, it is necessary to design each of source line SL and data buses DB1 and /DB1 arranged in parallel with the source line and included in the memory cell current path and the reference current path in such a way that they have the substantially same electrical resistance per unit length.

Figure 8:
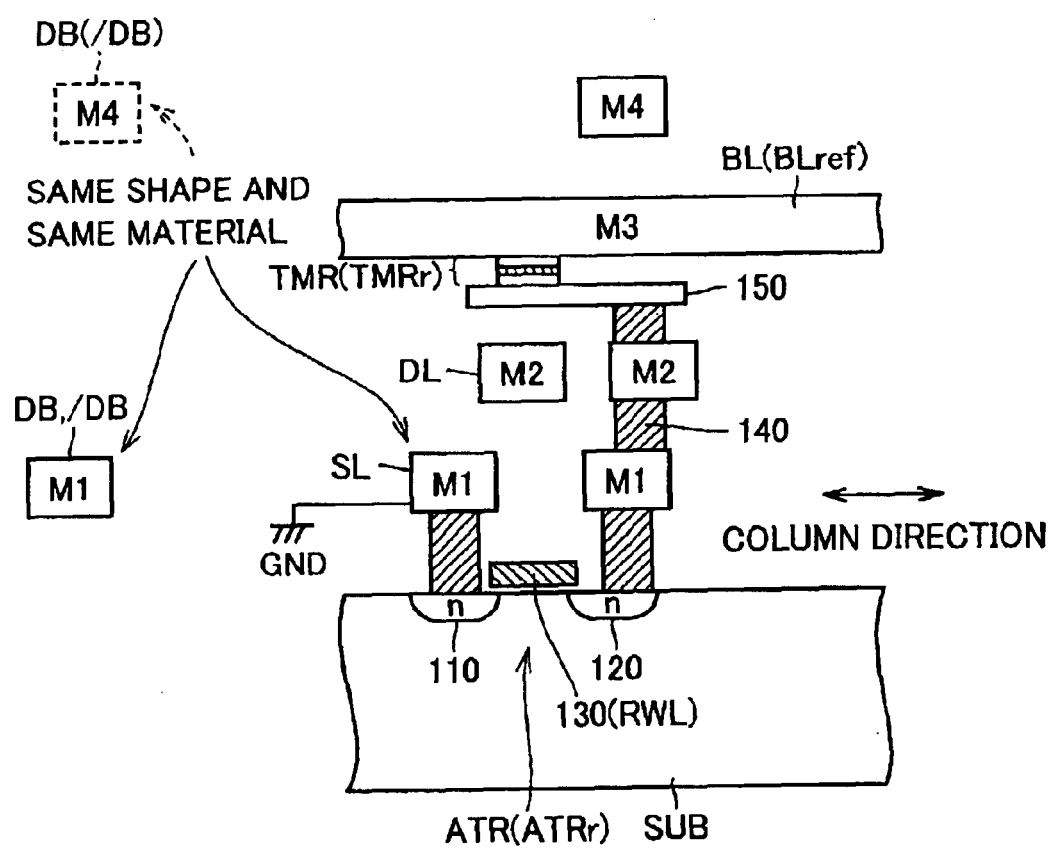
FIG. 8 is a cross sectional view showing a structure around memory cells and reference cells according to the second embodiment.

FIG. 8 is a cross sectional view showing a structure around memory cells and reference cells according to the second embodiment.

Referring to FIG. 8, the structure according to the second embodiment differs to that of the first embodiment shown in FIG. 3 in that the former structure has source line SL provided as a metal line. In other words, the structure according to the second embodiment requires one additional metal interconnection layer as compared with the structure shown in FIG. 3. For example, in metal interconnection layers M1, M2 and M3, source line SL, digit line DL and bit line BL are provided respectively.

Source line SL which is the metal line placed in the row direction is electrically coupled to respective source regions 110 of a plurality of access transistors ATR included in a corresponding memory cell row.

Moreover, in the region adjacent to memory array 10, the electrical resistance per unit length of data buses DB1 and /DB1 can be made substantially equal to that of source line SL, for example, by using the same metal interconnection layer M1 as that of source line SL to produce data buses DB1 and /DB1 of the same material and in the same shape as source line SL. Alternatively, a metal interconnection layer M4 above the layer of bit line BL may be used to produce data buses DB1 and /DB1 of the same material and in the same shape as source line SL. As described above, the memory cells and reference cells with the interconnection structure as shown in FIG. 8 may be combined with the structure of the first embodiment.

The structure as discussed above makes it possible to balance the path resistance of the memory cell current path and that of the reference current path even if the direction in which source line SL is placed to extend differs from the direction in which reference cells RMC are arranged. Accordingly, a difference in the total electrical resistance between the memory cell current path and the reference current path clearly reflects a difference in electrical resistance between selected memory cell MC# and selected reference cell RMC#. Reduction of the data reading margin depending on the result of address selection is thus avoided to stabilize the data reading operation.

Figure 9A:
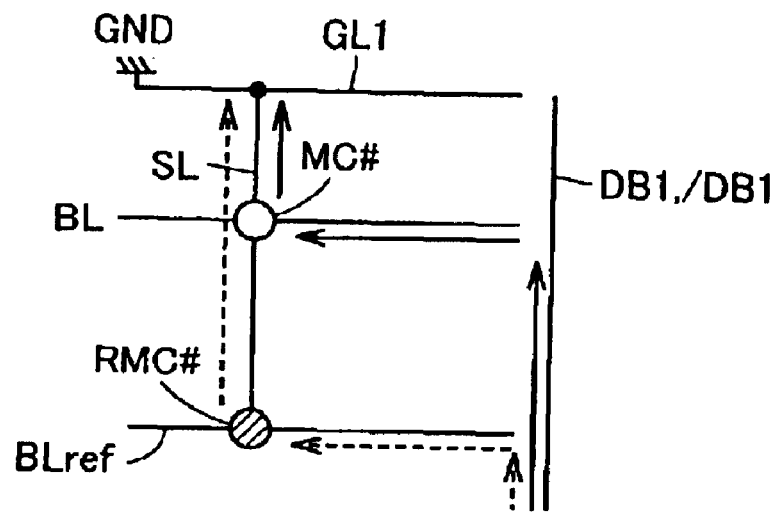
FIGS. 9A and 9B conceptually show examples of arrangement of ground lines in the configuration according to the second embodiment.
Figure 9B:
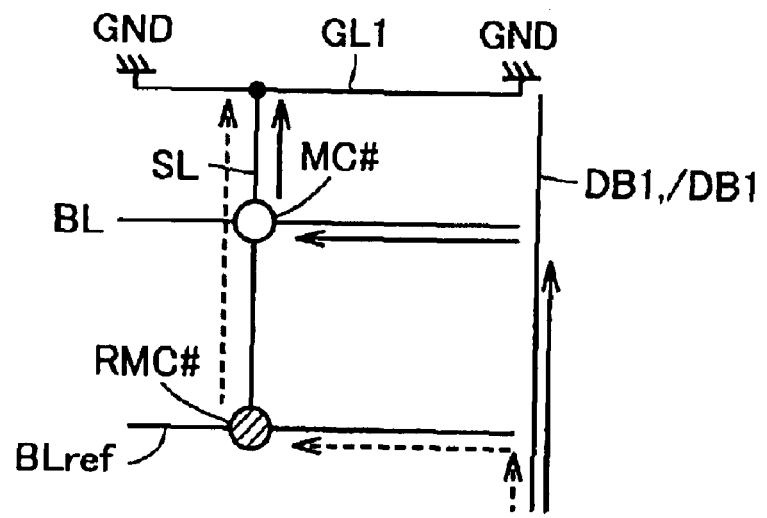

FIGS. 9A and 9B show variations of arrangement of ground lines in the region adjacent to memory array 10. The arrangement shown in FIG. 9A is the same as that shown in FIG. 8 and one end of ground line GL1 is connected to ground voltage GND.

Alternatively, as shown in FIG. 9B, both of the two ends of ground line GL1 may be connected to ground voltage GND. By the arrangement shown in FIG. 9B, the length of the current path on ground line GL1 that varies depending on the result of row direction can averagely be shortened. Then, the total resistance of the current path for the data read current can substantially be lowered to cut the power consumption.

Third Embodiment

According to a third embodiment, a configuration is described in which reference cells RMC are arranged in the column direction while source lines SL are also provided to extend in the column direction.

Figure 10:
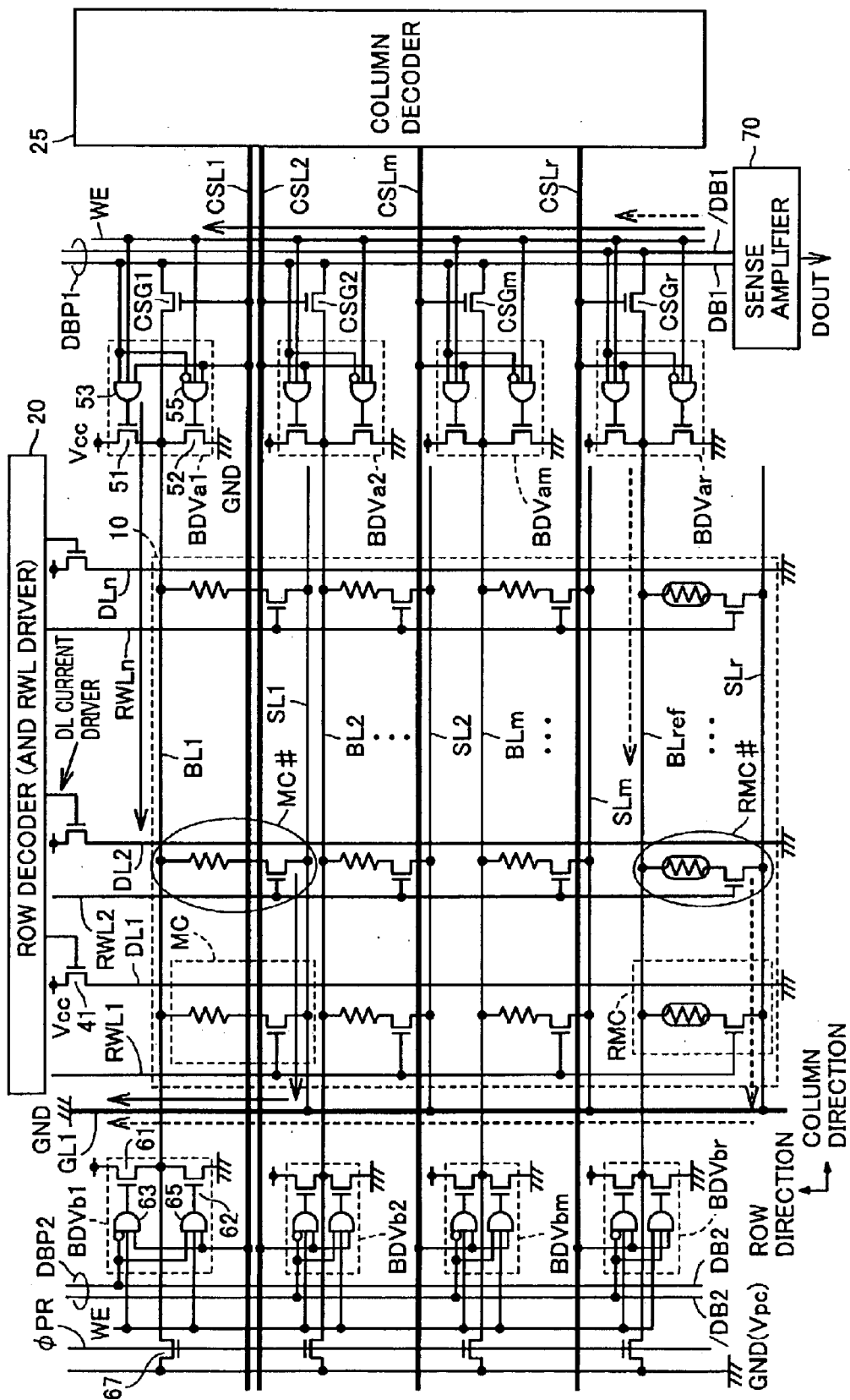
FIG. 10 is a circuit diagram showing a configuration of a memory array and peripheral circuitry thereof according to a third embodiment.

Referring to FIG. 10, the configuration shown in FIG. 10 differs from that of the second embodiment shown in FIG. 7 in that the former configuration has source lines SL1–SLm and SLr provided to extend in the column direction instead of source lines SL1–SLn placed to extend in the row direction. Source lines SL1–SLm are also collectively referred to as source line SL. Source line SLr is provided correspondingly to a reference cell column. A plurality of reference cells RMC are each connected between reference bit line BLref and source line SLr.

Source lines SL and SLr are provided to extend in the column direction, each having at least one of two ends coupled to ground voltage GND by a ground line. In the example shown in FIG. 10, one end of each of source lines SL and SLr (that one end being located in the region opposite to the region where sense amplifier 70 is located) is connected to ground line GL1 provided in the row direction. Ground line GL1 has its two ends both coupled to ground voltage GND.

The configuration of the circuitry except for that discussed above is similar to that shown in FIG. 7, and detailed description thereof is not repeated here. Here, data is written in a similar manner to that in the configuration shown in FIG. 2 by using digit line driver 41 of a selected row and bit line drivers BDVa, BDVb, /BDVa and /BDVb of a selected column.

An operation of reading data in the configuration according to the second embodiment is described below.

As for FIG. 10, like FIG. 2, read word line RWL2 and column selection line CSL1 are activated to H level to select, as selected memory cell MC#, a memory cell of the second row and the first column and select, as selected reference cell RMC#, a reference cell sharing the same memory cell row as selected memory cell MC#.

In data reading, a memory cell current is passed through a memory cell current path (indicated by the arrow of solid line in FIG. 10) composed of sense amplifier 70, data bus DB1, bit line BL1, selected memory cell MC#, source line SL1, ground line GL1 and ground voltage GND. On the other hand, a reference current is passed through a reference current path (indicated by the arrow of dotted line in FIG. 10) composed of sense amplifier 70, data bus /DB1, reference bit line BLref, selected reference cell RMC#, source line SLr, ground line GL1 and ground voltage GND.

As discussed above, in the configuration having the reference cell column, the length of the path on the line in the column direction of the memory cell current path is naturally balanced with that of the reference current path regardless of the result of row selection. Thus, in the configuration according to the third embodiment, source lines SL and SLr are provided to extend in the column direction to achieve a balance between the memory cell current path and the reference current path in terms of the length of the path on source lines SL and SLr regardless of the result of column selection.

Source line SL can thus be provided as a diffusion layer formed to extend in the column direction without newly providing a metal interconnection layer as found in the configuration shown in FIG. 2.

Figure 11:
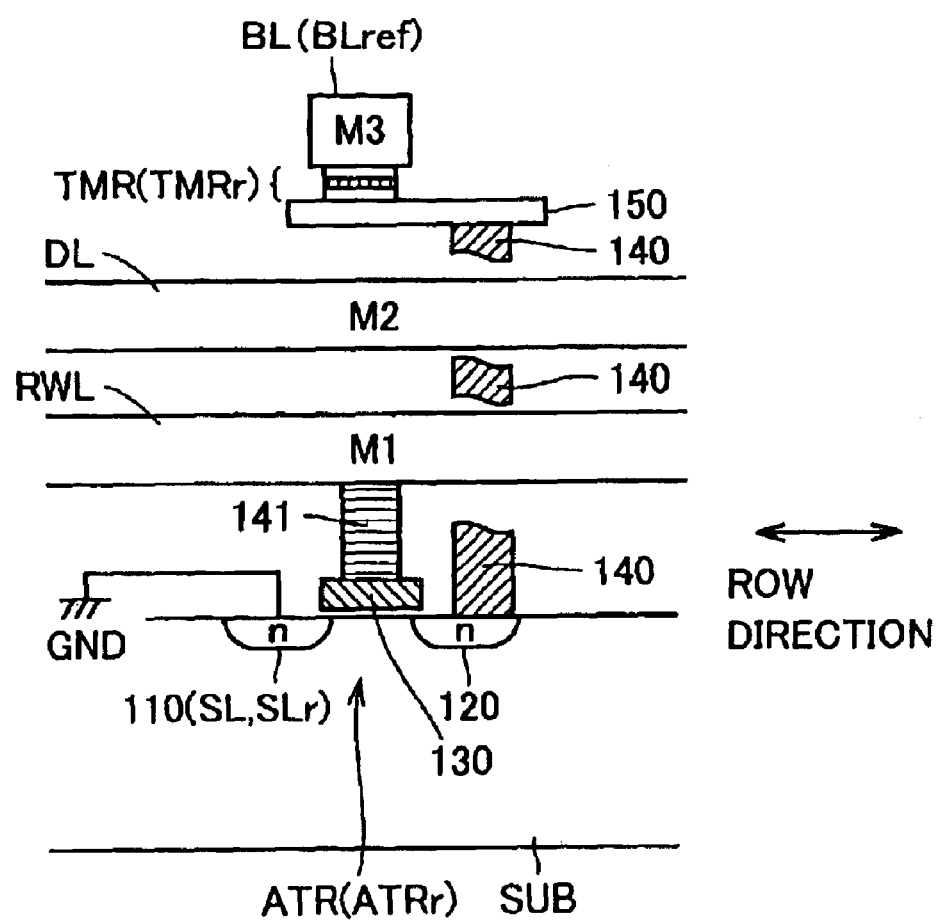
FIG. 11 is a cross sectional view showing an exemplary structure around memory cells and reference cells according to the third embodiment.

FIG. 11 is a cross sectional view showing an exemplary structure around memory cells and reference cells according to the third embodiment. In FIG. 11, an exemplary structure of an MTJ memory cell having source line SL provided as a diffusion layer is shown.

Referring to FIG. 11, in the structure according to the third embodiment, source line SL (or SLr) has a source region 110 electrically coupled between respective access transistors ATR (or access elements ATRr) of memory cells MC (or reference cells RC) adjacent to each other in the column direction.

In other words, source region 110 is formed as an impurity diffusion layer extending in the column direction. Such a source region 110 may electrically be coupled to ground voltage GND to use it as source line SL or SLr.

A drain region 120 is electrically coupled via a conductive strap 150 to tunneling magneto-resistance element TMR by a metal film 140 provided in a contact hole, similarly to that in the structure shown in FIG. 3. Read word line RWL and digit line DL are provided as metal lines in the row direction in metal interconnection layers M1 and M2 respectively. Access transistor ATR has its gate 130 electrically coupled to a corresponding read word line RWL via a metal film 141 formed in a contact hole.

Figure 12:
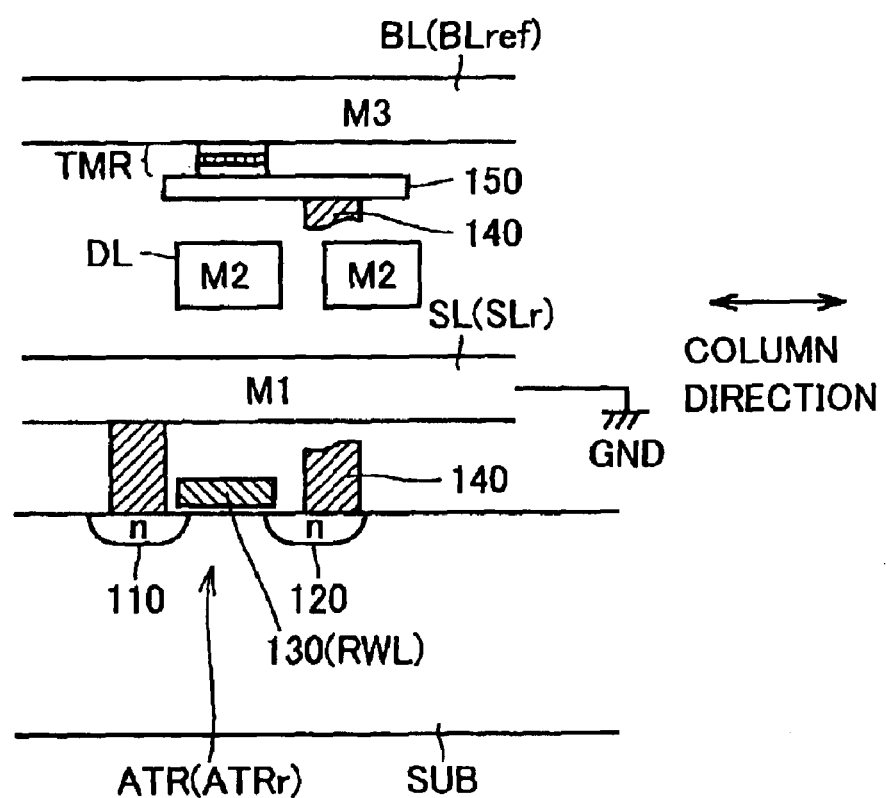
FIG. 12 is a cross sectional view showing another exemplary structure around memory cells and reference cells according to the third embodiment.

Alternatively, source line SL may be provided as a metal line as shown in FIG. 12.

Referring to FIG. 12, in this exemplary structure, each access transistor ATR (or access element ATRr) has its source region 110 electrically coupled to source line SL which is a metal line extending in the column direction. Read word line RWL, as that in the structure shown in FIG. 3, may be formed at gate 130 by a polysilicon line provided to extend in the row direction. The exemplary structure as shown in FIG. 12 except for the above-discussed structure is similar to that shown in FIG. 11 and detailed description thereof is not repeated here.

The exemplary structure shown in FIG. 12 has the increased number of required metal interconnection layers. However, the resistance of source line SL can be decreased and thus the total electrical resistance of the memory cell current path and the reference current path can be reduced.

As discussed above, any of the structures shown in FIGS. 12 and 13 may be employed for memory cell MC and reference cell RMC to balance the path resistance of the memory cell current path with that of the reference current path regardless of the result of address selection and accordingly ensure the data reading margin.

It is noted that, in the configuration having the reference cell column, there arises a difference, between the memory cell current path and the reference current path, in the path length on the line in the row direction, depending on which column is selected. However, as data buses DB1 and /DB1 and ground line GL1 provided in the row direction are formed of respective metal lines of a low-electrical-resistance material. Then, there is a low possibility that such a difference in path length causes a difference in path resistance which is sufficiently large to influence the data reading margin.

Alternatively, a further desirable configuration may be provided in which data buses DB1 and/DB1 and ground line GL1 placed in the row direction may be designed to have respective electrical resistances per unit length that are equal to each other. Then, the difference in path resistance between the memory cell current path and the reference current path, depending on the result of column selection, may be reduced to further improve the data reading margin. The electrical resistances per unit length may be made substantially equal by forming data buses DB1 and /DB1 and ground line GL1 each in the same shape and of the same material.

Figure 13A:
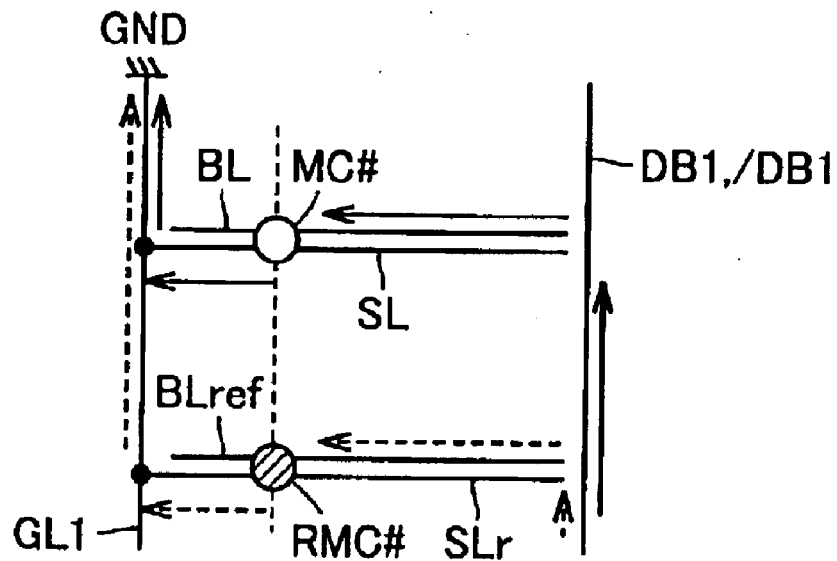
FIGS. 13A and 13B conceptually show examples of arrangement of ground lines in the configuration according to the third embodiment.
Figure 13B:
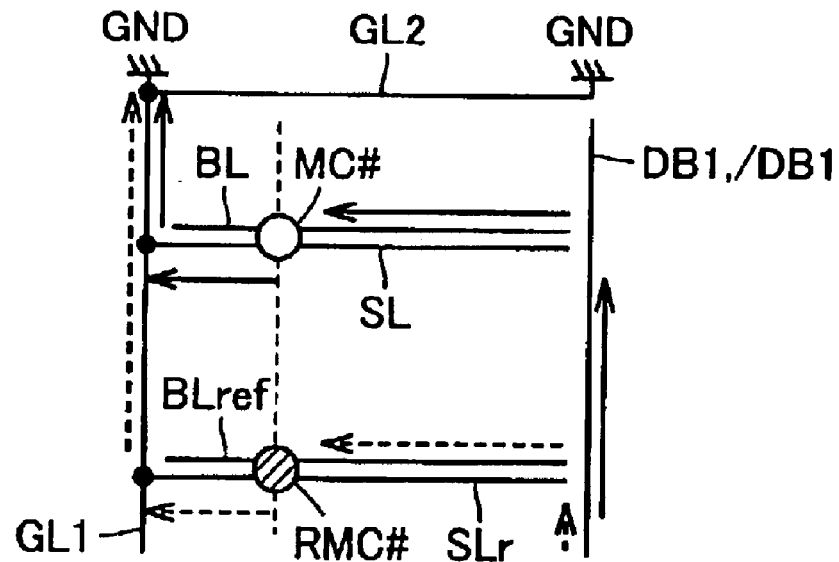

FIGS. 13A and 13B show variations of the arrangement of ground lines GL1 and GL2. FIG. 13A shows, as FIG. 10, ground line GL1 in the row direction that is connected to ground voltage GND at a node located in a region opposite to the region where sense amplifier 70 is located. In this case, as detailed above, the memory cell current path and the reference current path have respective path lengths on source lines SL and SLr, this path length being a main cause for unbalance in path resistance, that are made equal to each other regardless of the result of address selection. Moreover, in terms of the total path length on the lines in the row direction (ground line GL and data buses DB1 and /DB1), the memory cell current path and the reference current path are balanced regardless of the result of address selection.

As described above, ground line GL and data buses DB1 and /DB1 may thus be designed in such a way that respective electrical resistances per unit length of them are substantially equal to each other, so as to further improve the precision in data reading.

Alternatively, as shown in FIG. 13B, additional ground line GL2 may be provided in the column direction in a region adjacent to memory array 10. The length of the memory cell current path that varies depending on the position of selected memory cell MC# is thus shortened effectively, providing reduction in the electrical resistance of this current path and accordingly reduction in the power consumption.

Fourth Embodiment

According to a fourth embodiment, a configuration is described where reference cells are arranged in the row direction like those of the first embodiment while source line SL is provided to extend in the column direction.

Figure 14:
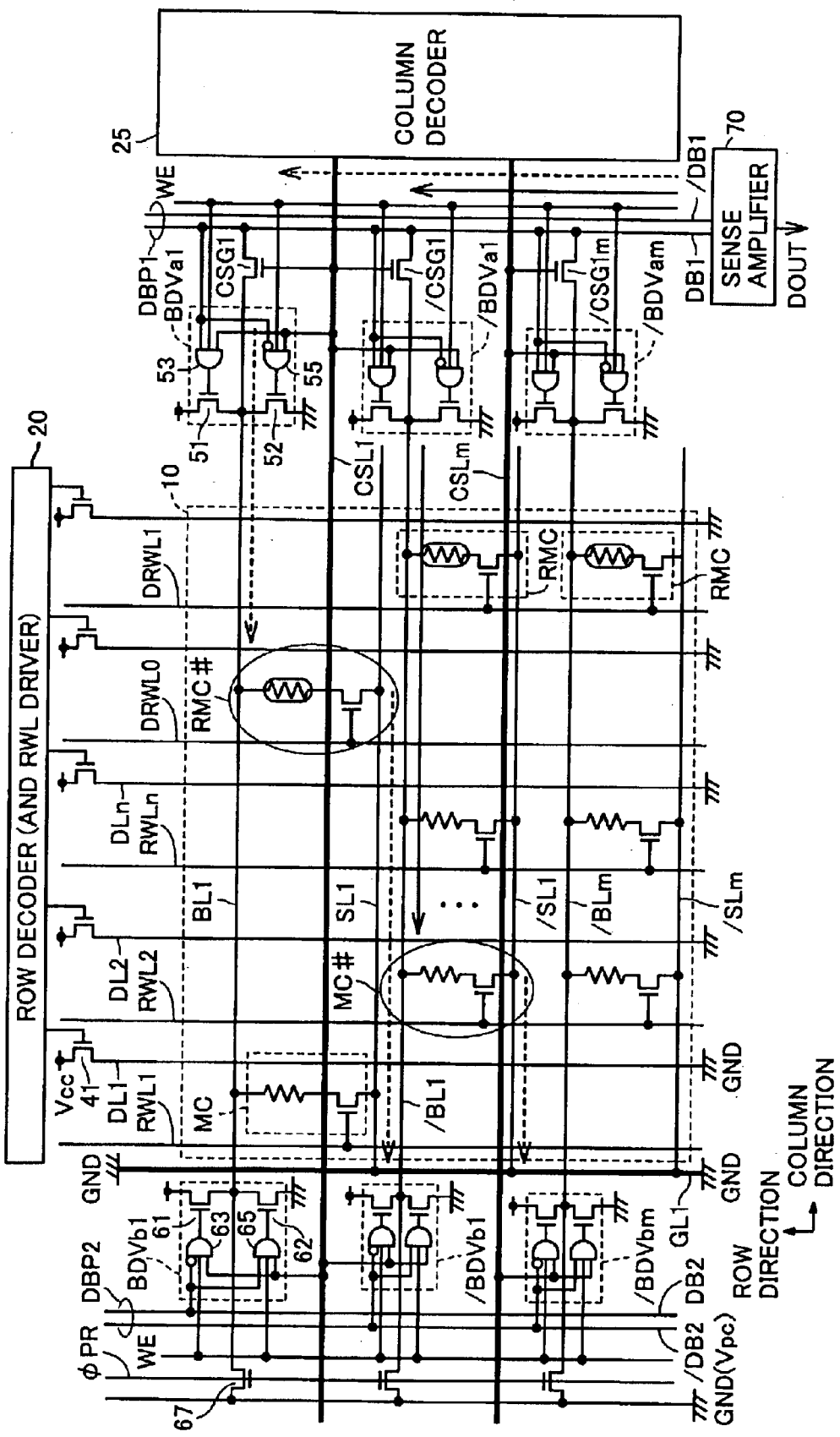
FIG. 14 is a circuit diagram showing a configuration of a memory array and peripheral circuitry thereof according to a fourth embodiment.

Referring to FIG. 14, the configuration according to the fourth embodiment differs from that of the first embodiment shown in FIG. 2 in that the former configuration has source lines SL1, /SL1, . . . , /SLm provided in the column direction in stead of source lines SL1–SLn, SLd0 and SLd1 in the row direction. Source lines SL1–SLm are collectively referred to as source line SL while source lines /SL1–/SLm are collectively referred to as source line /SL.

Source lines SL and /SL are provided to extend in the column direction, each having at least one of its two ends coupled to ground voltage GND by a ground line. In the example shown in FIG. 14, one end of each source line (this end located in the region opposite to the region where sense amplifier 70 is located) is connected to ground line GL1 in the row direction. Ground line GL1 has two ends both coupled to ground voltage GND.

In each memory cell column, memory cell MC and reference cell RMC are each connected between one of bit lines BL and /BL and one of source lines SL and /SL.

The configuration shown in FIG. 14 except for the above-discussed one is similar to that shown in FIG. 2 and detailed description thereof is not repeated. Data is written as done in the configuration shown in FIG. 2, by using digit line driver 41 of a selected row and bit line drivers BDV1, BDVb, /BDVa, and /BDVb of a selected column.

An operation of reading data in the configuration according to the fourth embodiment is described below.

As for FIG. 14 like FIG. 2, read word line RWL2 and column selection line CSL1 are activated to H level to select, as selected memory cell MC#, a memory cell of the second row and the first column and select, as selected reference cell RMC#, a reference cell sharing the same memory cell column with selected memory cell MC#.

In data reading, a memory cell current is passed through a memory cell current path (indicated by the arrow of solid line in FIG. 14) composed of sense amplifier 70, data bus /DB1, bit line /BL1, selected memory cell MC#, source line /SL1, ground line GL1 and ground voltage GND. On the other hand, a reference current is passed through a reference current path (indicated by the arrow of dotted line in FIG. 14) composed of sense amplifier 70, data bus DB1, bit line BL1, selected reference cell RMC#, source line SL1, ground line GL1 and ground voltage GND.

In the configuration having reference cell rows, since selected memory cell MC# and selected reference cell RMC# are included in the same column, the length of the path on the line in the row direction of the memory cell current path is naturally balanced with that of the reference current path, namely the length of the path on data buses DB1 and /DB1 and ground line GL1, regardless of the result of row selection. On the other hand, the length of the path on the line in the column direction of the memory cell current path and that of the reference current path differ from each other.

Thus, in the configuration according to the fourth embodiment where reference cells are arranged in the direction different from that in which source line SL extends, respective lengths of current paths on source lines SL and /SL of the memory cell current path and the reference current path inevitably differ from each other. Therefore, it is required to design source lines SL and /SL and data buses DB1 and /DB1 provided in parallel with source lines SL and /SL and included in the memory cell current path and the reference current path in such a way that these lines and paths have respective electrical resistances per unit length that are equal to each other. In other words, the structure shown in FIG. 12 should be applied to memory cell MC and reference cell RMC to form source line SL of the metal line.

Accordingly, even if the direction in which source line SL is provided to extend differs from the direction in which reference cells are arranged, the memory cell current path can be balanced with the reference current path in terms of the path resistance regardless of the result of address selection. As a result, it is possible to prevent deterioration in the data reading margin depending on the result of address selection.

Figure 15A:
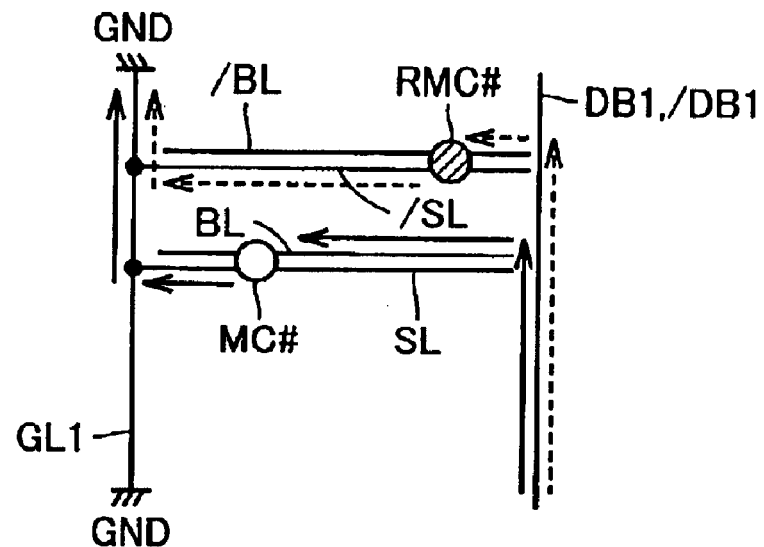
FIGS. 15A and 15B conceptually show examples of arrangement of ground lines in the configuration according to the fourth embodiment.
Figure 15B:
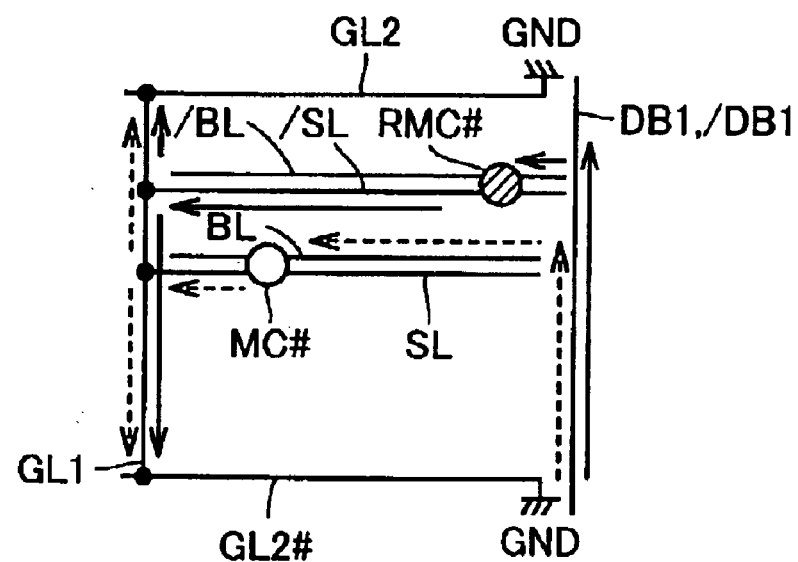

FIGS. 15A and 15B show variations of arrangement of ground lines placed in a region adjacent to memory array 10. FIG. 15A shows, like FIG. 14, ground line GL1 in the row direction having its two ends connected to ground voltage GND.

Alternatively, as shown in FIG. 15B, additional ground lines GL2 and GL2# may be provided in the column direction in respective regions adjacent to memory array 10. Ground lines GL2 and GL2# each have one end (located in the region where sense amplifier 70 is placed) coupled to ground voltage GND and the other end connected to ground line GL1. Accordingly, the memory cell current path and the reference current path are arranged symmetrically, which further improves the precision in data reading.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A memory device comprising:
a memory array having a plurality of memory cells and a plurality of reference cells arranged in rows and columns, said plurality of memory cells each having one of electrical resistances of respective two levels according to storage data and said plurality of reference cells each being provided as a comparison target for selected one of said plurality of memory cells in data reading,
said plurality of reference cells being arranged along one of said rows and said columns to share the other of said rows and said columns with said plurality of memory cells;
a plurality of word lines provided correspondingly to said rows respectively and activated in a selected row;
a plurality of data lines provided correspondingly to said columns respectively; and
a plurality of source lines provided correspondingly to said one of said rows and said columns respectively, said source lines each supplying a fixed voltage,
said plurality of memory cells each including a storage element having an electrical resistance varying according to said storage data and an access element turned on in response to activation of corresponding one of said word lines, said storage element and said access element being connected in series between corresponding one of said plurality of data lines and corresponding one of said plurality of source lines,
said plurality of data lines including
a first data line connected to the selected memory cell among said plurality of memory cells that is selected in said data reading and
a second data line connected to a selected reference cell among said plurality of reference cells in said data reading, said selected reference cell sharing said other of said rows and said columns with said selected memory cell and, said memory device further comprising
a data reading circuit coupling, in said data reading, said first and second data lines to a voltage different from said fixed voltage to form first and second current paths respectively passing said selected memory cell and said selected reference cell,
said data reading circuit reading said storage data from said selected memory cell according to a difference in electrical resistance between said first and second current paths.

2. The memory device according to claim 1, wherein
said plurality of data lines have an electrical resistance per unit length that is lower than an electrical resistance per unit length of said plurality of source lines.

3. The memory device according to claim 2, wherein
said plurality of data lines are formed of metal lines, and
said plurality of source lines are formed of impurity diffusion layers provided to extend along said one of said rows and said columns on a semiconductor substrate.

4. The memory device according to claim 1, further comprising a fixed voltage line provided in a region adjacent to said memory array along said other of said rows and said columns, wherein
said plurality of source lines are each electrically coupled to said fixed voltage line.

5. The memory device according to claim 4, wherein
an electrical resistance per unit length of said fixed voltage line is lower than an electrical resistance per unit length of said plurality of source lines.

6. The memory device according to claim 5, further comprising first and second data buses provided along said rows in a region adjacent to said memory array, wherein
in said data reading, said first and second data lines are electrically connected to said data reading circuit via said first and second data buses, and
said electrical resistance per unit length of said fixed voltage line is designed to be substantially equal to an electrical resistance per unit length of one of said plurality of data lines and said data buses, said one of said data lines and said data buses being arranged in the same direction as the direction in which said fixed voltage line is provided.

7. The memory device according to claim 1, wherein
said plurality of data lines and said plurality of source lines are arranged to balance an electrical resistance of said first current path except for said selected memory cell with an electrical resistance of said second current path except for said selected reference cell in said data reading.

8. The memory device according to claim 1, wherein
said storage element has a plurality of magnetic layers, and
at least one of said plurality of magnetic layers is magnetized in a direction according to said storage data.

9. The memory device according to claim 1, wherein
said first and second data lines are electrically coupled to a common voltage different from said fixed voltage in said data reading, and
said data reading circuit reads said storage data from said selected memory cell according to a difference in current passing through said first and second data lines.

10. The memory device according to claim 1, wherein
said first and second data lines are supplied with the same current in said data reading, and
said data reading circuit reads said storage data from said selected memory cell according to a difference in voltage of said first and second data lines.

11. A memory device comprising:
a memory array having a plurality of memory cells and a plurality of reference cells arranged in rows and columns, said plurality of memory cells each having one of electrical resistances of respective two levels according to storage data and said plurality of reference cells each being provided as a comparison target for selected one of said plurality of memory cells in data reading, said plurality of reference cells being arranged along said rows to share said columns with said plurality of memory cells;

a plurality of word lines provided correspondingly to said rows respectively and activated in a selected row;

a plurality of data lines provided correspondingly to said columns respectively; and a plurality of source lines provided correspondingly to said columns respectively, said source lines each supplying a fixed voltage, said plurality of memory cells each including a storage element having an electrical resistance varying according to said storage data and an access element turned on in response to activation of corresponding one of said word lines, said storage element and said access element being connected in series between corresponding one of said plurality of data lines and corresponding one of said plurality of source lines, said plurality of data lines including
a first data line connected to a selected memory cell among said plurality of memory cells that is selected in said data reading and
a second data line connected to the selected reference cell among said plurality of reference cells in said data reading, said selected reference cell sharing said columns with said selected memory cell and, said memory device further comprising
a data reading circuit coupling, in said data reading, said first and second data lines to a voltage different from said fixed voltage to form first and second current paths respectively passing said selected memory cell and said selected reference cell,
said data reading circuit reading said storage data from said selected memory cell according to a difference in electrical resistance between said first and second current paths, and
an electrical resistance per unit length of said plurality of data lines being designed to be equal to an electrical resistance per unit length of said plurality of source lines.

12. The memory device according to claim 11, wherein said plurality of data lines and said plurality of source lines are arranged to balance an electrical resistance of said first current path except for said selected memory cell with an electrical resistance of said second current path except for said selected reference cell in said data reading.

13. The memory device according to claim 11, wherein said storage element has a plurality of magnetic layers, and at least one of said plurality of magnetic layers is magnetized in a direction according to said storage data.

14. The memory device according to claim 11, wherein said first and second data lines are electrically coupled to a common voltage different from said fixed voltage in said data reading, and said data reading circuit reads said storage data from said selected memory cell according to a difference in current passing through said first and second data lines.

15. The memory device according to claim 11, wherein said first and second data lines are supplied with the same current in said data reading, and said data reading circuit reads said storage data from said selected memory cell according to a difference in voltage of said first and second data lines.

16. A memory device comprising:

a memory array having a plurality of memory cells and a plurality of reference cells arranged in rows and columns, said plurality of memory cells each having one of electrical resistances of respective two levels according to storage data and said plurality of reference cells each being provided as a comparison target for selected one of said plurality of memory cells in data reading, said plurality of reference cells being arranged along said columns to share said rows with said plurality of memory cells;

a plurality of word lines provided correspondingly to said rows respectively and activated in a selected row;

a plurality of data lines provided correspondingly to said columns respectively; and a plurality of source lines provided correspondingly to said rows respectively, said source lines each supplying a fixed voltage, said plurality of memory cells each including a storage element having an electrical resistance varying according to said storage data and an access element turned on in response to activation of corresponding one of said word lines, said storage element and said access element being connected in series between corresponding one of said plurality of data lines and corresponding one of said plurality of source lines, said plurality of data lines including
a first data line connected to the selected memory cell among said plurality of memory cells that is selected in said data reading and
a second data line connected to a selected reference cell among said plurality of reference cells in said data reading, said selected reference cell sharing said rows with said selected memory cell and, said memory device further comprising:
first and second data buses provided along said rows in a region adjacent to said memory array, said first and second data buses being connected electrically to said first and second data lines in said data reading; and
a data reading circuit coupling, in said data reading, said first and second data buses to a voltage different from said fixed voltage to form first and second current paths respectively passing said selected memory cell and said selected reference cell,
said data reading circuit reading said storage data from said selected memory cell according to a difference in electrical resistance between said first and second current paths, and
an electrical resistance per unit length of said plurality of source lines being designed to be substantially equal to an electrical resistance per unit length of said first and second data lines.

17. The memory device according to claim 16, wherein said plurality of data lines, said plurality of source lines and said first and second data buses are arranged to balance an electrical resistance of said first current path except for said selected memory cell with an electrical resistance of said second current path except for said selected reference cell in said data reading.

18. The memory device according to claim 16, wherein said storage element has a plurality of magnetic layers, and at least one of said plurality of magnetic layers is magnetized in a direction according to said storage data.

19. The memory device according to claim 16, wherein said first and second data lines are electrically coupled to a common voltage different from said fixed voltage in said data reading, and said data reading circuit reads said storage data from said selected memory cell according to a difference in current passing through said first and second data lines.

20. The memory device according to claim 16, wherein said first and second data lines are supplied with the same current in said data reading, and said data reading circuit reads said storage data from said selected memory cell according to a difference in voltage of said first and second data lines.

* * * * *